(12) United States Patent
Saitoh et al.

(10) Patent No.: US 12,317,706 B2
(45) Date of Patent: May 27, 2025

(54) DISPLAY DEVICE

(71) Applicant: SHARP KABUSHIKI KAISHA, Sakai (JP)

(72) Inventors: Takao Saitoh, Sakai (JP); Masaki Yamanaka, Sakai (JP); Yi Sun, Sakai (JP); Yohsuke Kanzaki, Sakai (JP); Masahiko Miwa, Sakai (JP)

(73) Assignee: SHARP KABUSHIKI KAISHA, Sakai (JP)

( * ) Notice: Subject to any disclaimer, the term of this patent is extended or adjusted under 35 U.S.C. 154(b) by 518 days.

(21) Appl. No.: 17/909,691

(22) PCT Filed: Mar. 11, 2020

(86) PCT No.: PCT/JP2020/010615
§ 371 (c)(1),
(2) Date: Sep. 6, 2022

(87) PCT Pub. No.: WO2021/181577
PCT Pub. Date: Sep. 16, 2021

(65) Prior Publication Data
US 2023/0109516 A1    Apr. 6, 2023

(51) Int. Cl.
| | |
|---|---|
| *H01L 29/08* | (2006.01) |
| *H10K 59/121* | (2023.01) |
| *H10K 59/131* | (2023.01) |
| *H10K 71/00* | (2023.01) |
| *H10K 71/80* | (2023.01) |
| *H10K 77/10* | (2023.01) |
| *H10K 59/12* | (2023.01) |
| *H10K 102/00* | (2023.01) |

(52) U.S. Cl.
CPC ....... *H10K 59/131* (2023.02); *H10K 59/1213* (2023.02); *H10K 71/00* (2023.02); *H10K 71/80* (2023.02); *H10K 77/111* (2023.02); *H10K 59/1201* (2023.02); *H10K 2102/311* (2023.02)

(58) Field of Classification Search
CPC ............. H10K 59/131; H10K 59/1201; H10K 59/1213; H10K 71/00; H10K 71/80; H10K 77/111; H10K 2102/311
USPC .......................................................... 257/40
See application file for complete search history.

(56) References Cited

U.S. PATENT DOCUMENTS

2020/0083474 A1*   3/2020   Lee ................... H10K 59/131

FOREIGN PATENT DOCUMENTS

| CN | 110875440 A | * | 3/2020 | ........... G06F 3/0412 |
| JP | 2007-288080 A | | 11/2007 | |
| TW | 201411854 A | * | 3/2014 | ....... G02F 1/134363 |

OTHER PUBLICATIONS

Machine translation Cheng Y (CN-110875440-A).*
Machine translation Yamazaki S (TW-201411854-A).*

* cited by examiner

*Primary Examiner* — Phuc T Dang
(74) *Attorney, Agent, or Firm* — ScienBiziP, P.C.

(57) ABSTRACT

A display device according to an aspect of the disclosure includes a display region. The display region is provided with a plurality of first grooves and a plurality of second grooves formed between adjacent control lines and spaced apart from the plurality of control lines, in a plan view. Each of the plurality of first grooves extends in a second direction along a coupling semiconductor layer, between the adjacent control lines, in a plan view. Each of the plurality of second grooves extends in a direction intersecting a first groove of the plurality of first grooves, and is adjacent to at least one end portion of the first groove.

13 Claims, 17 Drawing Sheets

DISPLAY DEVICE

TECHNICAL FIELD

The disclosure relates to a display device.

BACKGROUND ART

PTL 1 relates to a flexible electronic device and discloses suppression of crack occurrence and propagation by providing patterned slits or holes in at least a portion of gate electrodes and source/drain electrodes constituting thin film transistors.

CITATION LIST

Patent Literature

PTL 1: JP 2007-288080 A

SUMMARY

Technical Problem

However, cracks readily progress (propagate) along an inorganic insulating layer which is a brittle material. Therefore, even when slits and holes are formed in the electrodes as described above, the effect of preventing the propagation of cracks is inadequate.

In particular, in a display device having a structure in which a wiring line layer including a gate electrode, a control line, and the like is formed on a gate insulating film covering a semiconductor layer, cracks readily occur when the wiring line layer is formed on the gate insulating film. The cause of such cracks is a step formed by the semiconductor layer and, when a crack occurs in a control line on the semiconductor layer, the control line breaks. Further, the occurred crack propagates through the gate insulating film along the semiconductor layer. As a result, a new break may occur in the control line in the progressing direction of the crack.

The disclosure is made in view of the aforementioned problems, and an object thereof is to provide a display device that can prevent a break in a control line caused by progression of a crack.

Solution to Problem

In order to solve the problems described above, a display device according to an aspect of the present disclosure is a display device including a substrate, a semiconductor layer, a gate insulating film, a first wiring line, a first interlayer insulating film, a second wiring line, a second interlayer insulating film, a third wiring line, a display region, and a frame region surrounding the display region. The substrate, the semiconductor layer, the gate insulating film, the first wiring line, the first interlayer insulating film, the second wiring line, the second interlayer insulating film, and the third wiring line are provided in this order. The display region is provided with a plurality of control lines included in the first wiring line and extending in a first direction, a plurality of data signal lines included in the third wiring line and extending in a second direction orthogonal to the first direction, a plurality of subpixels provided correspondingly to intersecting portions between the plurality of control lines and the plurality of data signal lines, a plurality of light-emitting elements provided correspondingly to the plurality of subpixels, a plurality of coupling semiconductor layers included in the semiconductor layer, and extending in the second direction across the plurality of subpixels in the second direction, intersecting the plurality of control lines in a plan view, and a plurality of first grooves and a plurality of second grooves formed between adjacent control lines of the plurality of control lines in the gate insulating film and spaced part from the plurality of control lines, in a plan view. Each of the plurality of first grooves extends in the second direction along a coupling semiconductor layer of the plurality of coupling semiconductor layers, between the adjacent control lines, in a plan view, and each of the plurality of second grooves extends in a direction intersecting a first groove of the plurality of first grooves, and is adjacent to at least one end portion of the first groove.

Advantageous Effects of Disclosure

The first grooves described above are more susceptible to cracking than a step portion of the semiconductor layer and, in the event a crack occur, the crack selectively occurs in the first groove. Therefore, the first grooves described above each serve as an origin for crack occurrence caused by stress concentration, and function as a crack-guiding pattern that guides cracks to the second grooves. The second grooves each functions as a crack stopper that stops the progression (propagation) of a crack. Further, the first grooves and the second grooves, in a plan view, are provided between adjacent control lines, spaced apart from the adjacent control lines, and do not intersect the control lines. Thus, according to the aspect described above, it is possible to prevent the control lines from breaking at edge portions of the coupling semiconductor layers described above, and prevent a new break from occurring in a wiring line due to progression of the crack, in the progressing direction of the crack. Therefore, according to the aspect described above, it is possible to provide a display device that can prevent occurrence of a wiring line break caused by progression of a crack.

DESCRIPTION OF EMBODIMENTS

Hereinafter, "the same layer" means that the layer is formed in the same process (film formation process), "a lower layer" means that the layer is formed in an earlier process than the process in which the layer to compare is formed, and "an upper layer" means that the layer is formed in a later process than the process in which the layer to compare is formed.

First Embodiment

Figure 4:
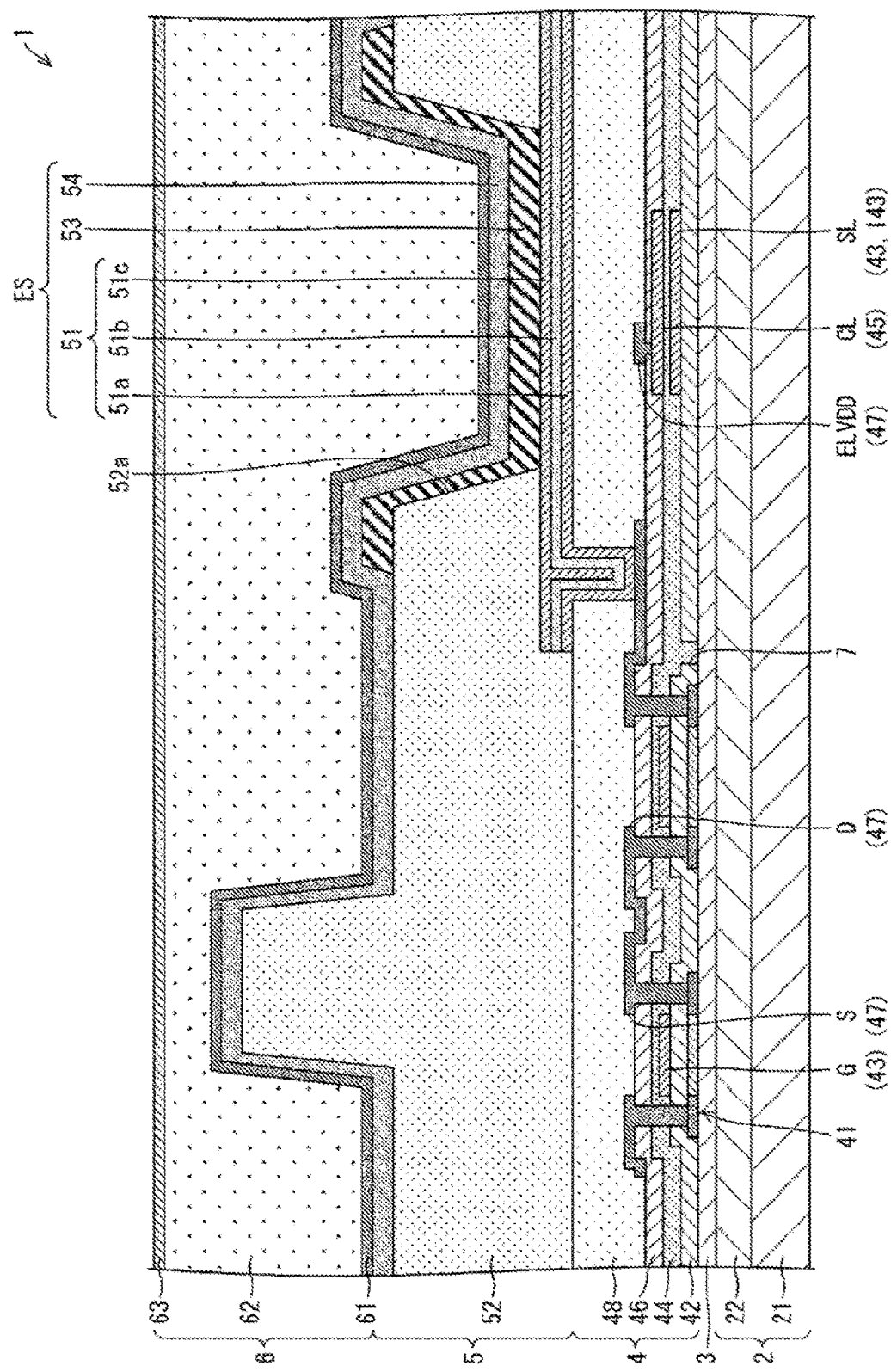
FIG. 4 is a cross-sectional view illustrating a schematic configuration of the main portions of the display device according to the first embodiment.

FIG. 4 is a cross-sectional view illustrating a schematic configuration of main portions of a display device 1 according to the present embodiment.

As illustrated in FIG. 4, the display device 1 has a configuration in which a base coat film 3, a thin film transistor layer 4, a light-emitting element layer 5, and a sealing layer 6 are layered in this order on a support body 2. The light-emitting element layer 5 is provided on the thin film transistor layer 4, and includes a plurality of light-emitting elements ES. The thin film transistor layer 4 includes a plurality of thin film transistors that drive these light-emitting elements ES. The light-emitting element layer 5 is covered by a sealing layer 6. Note that, in the following, the support body 2 side will be referred to as a lower side, and the sealing layer 6 side will be referred to as an upper side.

In FIG. 4, an example is illustrated of a case in which the substrate is a flexible substrate, and the display device 1 is a flexible display device. The support body 2 illustrated in FIG. 4 has a configuration in which, for example, a lower face film 21 and a resin layer 22 serving as a substrate (flexible substrate) are layered in this order from a lower layer side.

Examples of the resin used for the resin layer 22 described above include polyimide, polyethylene, and polyamide.

The lower face film 21 is bonded to a lower face of the resin layer 22 from which a carrier substrate such as a glass substrate used in the manufacture of the display device 1 has been peeled, and thus, even when the resin layer 22 is extremely thin, is suitable for manufacturing a flexible display device having sufficient strength. A plastic film formed of, for example, a resin having flexibility, such as polyethylene terephthalate, polyimide, or polycarbonate, is used for the lower face film 21.

As described above, desirably the substrate is formed of a resin. However, the present embodiment is not limited to this example, and a glass substrate, for example, may be used as the substrate.

The base coat film 3 is a moisture-proof layer, and prevents moisture and impurities from reaching the thin film transistor layer 4 and the light-emitting element layer 5 formed on the support body 2. The base coat film 3 is provided on an entire upper face of the resin layer 22 so that a surface of the resin layer 22 is not exposed. The base coat film 3 can be formed of, for example, a silicon nitride (SiNx) film or silicon oxide (SiOx) film, or a layered film of these films. In other words, the base coat film 3 can be formed of, for example, at least one type of inorganic insulating film selected from the group consisting of a silicon nitride film and a silicon oxide film formed by chemical vapor deposition (CVD). Note that the base coat film 3 may be a silicon oxynitride (SiON) film, or may be a layered film formed by layering a silicon oxynitride film and at least one film of a silicon nitride film and a silicon oxide film.

A subpixel circuit that controls each of the light-emitting elements ES in the light-emitting element layer 5 is formed in the thin film transistor layer 4. The thin film transistor layer 4 has a configuration in which a semiconductor layer 41, a gate insulating film 42, a first wiring line 43, a first interlayer insulating film 44, a second wiring line 45, a second interlayer insulating film 46, a third wiring line 47, and a third interlayer insulating film 48 are provided in this order from the support body 2 side.

The semiconductor layer 41 is provided on the base coat film 3 in island shapes (specifically, in line shapes). The gate insulating film 42 is provided on the base coat film 3 across the entire area of a display region DA so as to cover the semiconductor layer 41. The first wiring line 43 is a first metal layer formed on the gate insulating film 42. The first interlayer insulating film 44 is provided on the gate insulating film 42, covering the first wiring line 43 and thus leveling a step formed by the first wiring line 43. The second wiring line 45 is a second metal layer formed on the first interlayer insulating film 44. The second interlayer insulating film 46 is provided on the first interlayer insulating film 44, covering the second wiring line 45 and thus leveling a step formed by the second wiring line 45. The third wiring line 47 is a third metal layer formed on the second interlayer insulating film 46. The third interlayer insulating film 48 is provided on the second interlayer insulating film 46, covering the third wiring line 47 and thus leveling a step formed by the third wiring line 47.

The semiconductor layer 41, a gate electrode G, the gate insulating film 42, a source electrode S, and a drain electrode D constitute each thin film transistor described below.

The semiconductor layer 41 forms a portion of thin film transistors as described above, and includes a coupling semiconductor layer 141 (refer to FIG. 1) that couples the thin film transistors, Note that the coupling semiconductor layer 141 will be described below.

The semiconductor layer 41 is formed of, for example, low-temperature polycrystalline silicon (LTPS). In a case in which the semiconductor layer 41 is LTPS, impurity ions such as phosphorus (P) are doped into the semiconductor layer 41 after formation of the first wiring line 43, and thus the impurity ions are doped only in a portion of the semiconductor layer 41 that does not overlap the first wiring line 43. As a result, as illustrated in FIG. 4, a thin film transistor having a top gate structure is formed, for example. However, the present embodiment is not limited thereto, and the semiconductor layer 41 described above may be constituted by an oxide semiconductor, for example. Examples of the oxide semiconductor described above include an In—Ga—Zn—O based semiconductor (for example, indium gallium zinc oxide). Even in a case in which the semiconductor layer 41 is other than LTPS, the thin film transistor having a top gate structure is formed by a similar or different method.

The first wiring line 43 includes a plurality of the gate electrodes G and control lines 143. The control lines 143 include a plurality of scanning signal lines SL and a plurality of light emission control lines EM illustrated in FIG. 1 to FIG. 3 described below. The first wiring line 43 is covered by the first interlayer insulating film 44.

The second wiring line 45 includes a capacitance wiring line CL and a capacitance electrode CE illustrated in FIG. 2 described below, and a plurality of initialization potential lines Vini illustrated in FIG. 1 and FIG. 2 described below. The second wiring line 45 is covered by the second interlayer insulating film 46.

The third wiring line 47 includes a plurality of the source electrodes S, a plurality of data signal lines DL, a plurality of the drain electrodes D, a high-level power source line ELVDD, and a low-level power source line (not illustrated). The third wiring line 47 is covered by the third interlayer insulating film 48. Note that, in the present embodiment, the high-level power source line is indicated by the same reference sign ELVDD as the high-level power source potential.

The source electrode S and the drain electrode D are each connected to the semiconductor layer 41 via a contact hole provided in the gate insulating film 42, the first interlayer insulating film 44, and the second interlayer insulating film 46. The source electrode S is connected to the data signal line DL, for example. The drain electrode D is connected to a first electrode 51 of the light-emitting element ES via a contact hole extending through the third interlayer insulating film 48. The capacitance wiring line CL is connected to the high-level power source line ELVDD via a contact hole extending through the second interlayer insulating film 46. Therefore, power source voltage on the same high potential side as the high-level power source line ELVDD is input to the capacitance wiring line CL.

The control lines 143 such as the scanning signal line SL and the light emission control line EM, the capacitance wiring line CL, and the initialization potential line Vini are wired extending in a row direction (first direction, horizontal direction in FIG. 2 described below). The high-level power source line ELVDD and the data signal line DL are wired extending in a column direction (second direction, vertical direction in FIG. 2 described below) orthogonal to the row direction.

The high-level power source line ELVDD is connected to a high-level power source circuit portion (not illustrated). Further, the low-level power source line is connected to a low-level power source circuit portion (not illustrated).

A voltage of the high-level potential ELVDD, which has a higher potential than a voltage of the low-level potential ELVSS, is applied to the high-level power source line ELVDD.

The high-level power source line ELVDD supplies the high-level potential ELVDD supplied from the high-level power source circuit portion to each light-emitting element ES in order to supply drive current (light-emitting current) in accordance with display data to the first electrode 51 (anode electrode) of each light-emitting element ES. The low-level power source line supplies the low-level potential ELVSS supplied from the low-level power source circuit portion to a second electrode 54 (cathode electrode) of each light-emitting element S. Note that the high-level potential ELVDD and the low-level potential ELVSS are each fixed potential.

The light emission control lines EM control the timing of light emission/non-emission of each light-emitting element ES. Each light emission control line EM and scanning signal line SL are respectively connected to a gate driver (not illustrated), and the data signal line DL is connected to a source driver (not illustrated).

The gate driver drives each of the scanning signal lines SL and each of the light emission control lines EM on the basis of a control signal, such as a clock signal, received from a display control circuit unit (not illustrated). The source driver is connected to each of the data signal lines DL and drives each of the data signal lines DL.

The first wiring line 43, the second wiring line 45, and the third wiring line 47 are each formed of a metal single layer film or layered film including at least one of aluminum, tungsten, molybdenum, tantalum, chromium, titanium, and copper, for example.

The gate insulating film 42, the first interlayer insulating film 44 and the second interlayer insulating film 46 may be formed of, for example, a silicon nitride film, a silicon oxide film, or a layered film of these, formed by CVD, as in the base coat film 3. Note that the gate insulating film 42, the first interlayer insulating film 44, and the second interlayer insulating film 46 may also be a silicon oxynitride film, or may be a layered film formed by layering a silicon oxynitride film and at least one film of a silicon nitride film and a silicon oxide film, as in the base coat film 3. The third interlayer insulating film 48 is a flattening film, and may be formed of, for example, a coatable organic material, such as a polyimide or an acrylic resin.

The light-emitting element layer 5 includes the first electrode 51, a bank 52, an active layer 53, and the second electrode 54, in this order from the thin film transistor layer 4 side. One and the other of the first electrode 51 and the second electrode 54 are an anode electrode and a cathode electrode. Note that, in the present embodiment, description is made using a case in which the first electrode 51 is an anode electrode (pattern anode electrode) patterned for each subpixel SP, and the second electrode 54 is a cathode electrode (common cathode electrode) formed in common to all subpixels SP as an example. However, the present embodiment is not limited thereto. Alternatively, the first electrode 51 may be a cathode electrode and the second electrode 54 may be an anode electrode.

The light-emitting element ES is a self-light-emitting element, and includes the first electrode 51, the active layer 53 including at least a light-emitting layer (function layer), and the second electrode 54. The light-emitting element ES is formed for each subpixel SP, in correspondence with each subpixel SP.

The bank 52 functions as an edge cover covering each edge of the first electrode 51, and functions as a subpixel separation film partitioning each subpixel SP. An opening 52a is provided in the bank 52 for each subpixel SP. An exposed portion via this opening 52a of the first electrode 51 forms a light-emitting region of each subpixel SP. The bank 52 is formed by applying, for example, an organic material having insulating properties, such as polyimide or acrylic, and subsequently patterning the organic material by photolithography.

The active layer 53 is a layer between the first electrode 51 and the second electrode 54 in the light-emitting, element ES, and includes at least a light-emitting layer. In a case in which the light-emitting element ES is a so-called organic light-emitting diode (OLED) that is referred to as an organic electroluminescence (EL) element, the active layer 53 is formed of an organic layer that is referred to as an organic EL layer. Note that the active layer 53 may be a single layer type formed only of a light-emitting layer, or may be a multi-layer type including a function layer other than the light-emitting layer. Further, the light-emitting element ES described above is not limited to an OLED, and may be, for example, a quantum dot light-emitting diode (QLED).

Examples of function layers other than the light-emitting layer of the active layer 53 include layers such as a hole injection layer, a hole transport layer, a hole blocking layer, an electron transport layer, and an electron injection layer.

Note that, of the first electrode 51 and the second electrode 54, the electrode on the light extraction surface side must have optical transparency. On the other hand, the electrode on the side opposite to the light extraction surface may or may not have optical transparency.

Note that, in FIG. 4, a case is illustrated, as an example, in which the display device 1 is a top-emitting display device. In this case, the first electrode 51 is formed of a light-reflecting electrode, and the second electrode 54 is formed of, for example, a semitransparent electrode. The first electrode 51 and the second electrode 54 may each be a single layer or may each have a layered structure. In a case in which the display device 1 is a top-emitting display device as described above, the first electrode 51 may have a layered structure of a light-reflecting electrode and a transparent electrode. FIG. 4 illustrates, as an example, a case in which the first electrode 51 has a structure in which, from the lower layer side, a transparent electrode 51a, a light-reflecting electrode 51b, and a transparent electrode 51c are layered in this order.

Indium tin oxide (ITO) or indium zinc oxide (IZO), for example, is used as the transparent electrode. Silver (Ag) or an alloy including Ag, for example, is used as the light-reflecting electrode. A thin metal film having optical transparency such as a magnesium silver alloy, for example, is used as the semitransparent electrode.

Note that the display device 1 may have a bottom-emitting structure. In this case, the first electrode 51, which is on the light extraction surface side, is formed of a semitransparent electrode, and the second electrode 54 is formed of a light-reflecting electrode.

The sealing layer 6 is a layer that prevents penetration of foreign matters such as water and oxygen into the light-emitting element layer 5. The sealing layer 6 includes, for example, an inorganic sealing film 61 that covers the second electrode 54, an organic buffer film 62 that is an upper layer overlying the inorganic sealing film 61, and an inorganic sealing film 63 that is an upper layer overlying the organic buffer film 62.

The inorganic sealing film 61 and the inorganic sealing film 63 are transparent inorganic insulating films and can be formed of, for example, a silicon oxide film, a silicon nitride film, or a layered film of these, formed by CVD. The organic buffer film 62 is a transparent organic insulating film having a flattening effect and can be formed of a coatable organic material such as an acrylic. The organic buffer film 62 can be formed by, for example, ink-jet application, and a bank (not illustrated) for stopping droplets may be provided in a frame region NDA.

A function film (not illustrated) is provided on the sealing layer 6. The function film has, for example, at least one of an optical compensation function, a touch sensor function, and a protection function.

Figure 3:
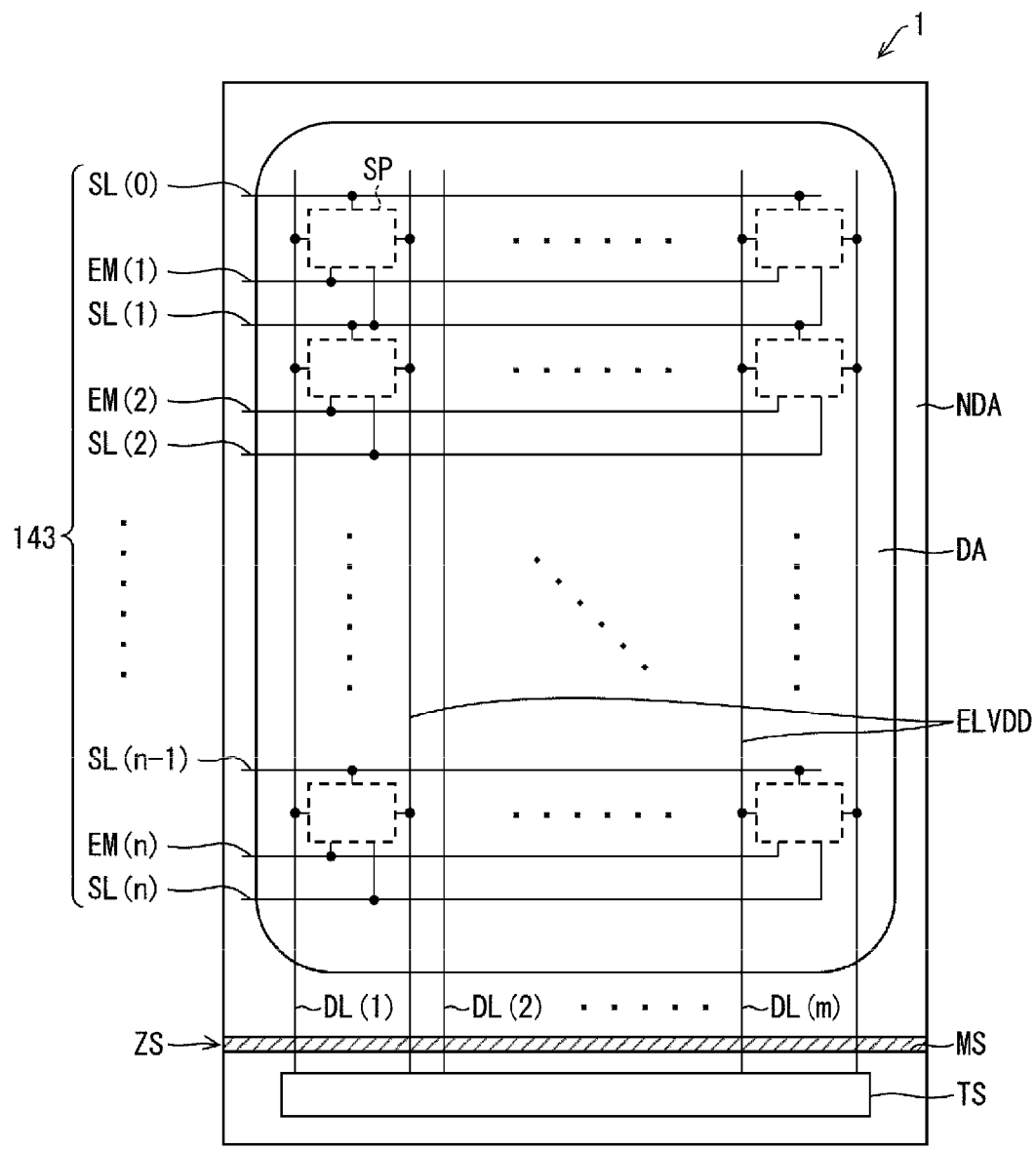
FIG. 3 is a plan view schematically illustrating an overall configuration of main portions of the display device according to the first embodiment.

FIG. 3 is a plan view schematically illustrating an overall configuration of main portions of the display device 1 according to the present embodiment.

As illustrated in FIG. 3, the display device 1 according to the present embodiment includes, in a plan view, the display region DA and the frame region NDA, which is a non-display region surrounding the display region DA. The frame region NDA includes a terminal portion TS disposed at an edge thereof, and a bending portion ZS provided between the terminal portion TS and the display region DA. The terminal portion TS is provided with an electronic circuit board (not illustrated) such as an integrated circuit (IC) chip and a flexible printed circuit board (FPC).

As illustrated in FIG. 3, in the display region DA, the control lines 143, such as the plurality of scanning signal lines SL (0) to SL (n) (where n is any integer) and the plurality of light emission control lines EM (1) to EM (n) (where n is any integer), extend in the row direction. Note that, hereinafter, the scanning signal lines SL (0) to SL (n) are collectively referred to as "scanning signal lines SL." Further, the light emission control lines EM (1) to EM (n) are collectively referred to as "light emission control lines EM." Further, in the display region DA, the plurality of data signal lines DL (1) to DL (m) (where m is any integer) extend in the column direction so as to be orthogonal to the control lines 143 such as the scanning signal lines SL and the light emission control lines EM. Furthermore, in the display region DA, a plurality of the subpixels SP are provided in a matrix shape in correspondence with intersecting portions of the control lines 143, such as the plurality of scanning signal lines SL and the plurality of light emission control lines EM, and the plurality of data signal lines DL. Each subpixel SP includes a subpixel circuit PK (refer to FIG. 2) that controls the light-emitting element ES in each subpixel SP. In other words, the light-emitting element ES and the subpixel circuit PK are provided for each subpixel SP in the display region DA, in correspondence with each subpixel SP. The subpixel circuit PK and the wiring lines connected thereto are formed in the thin film transistor layer 4.

Figure 2:
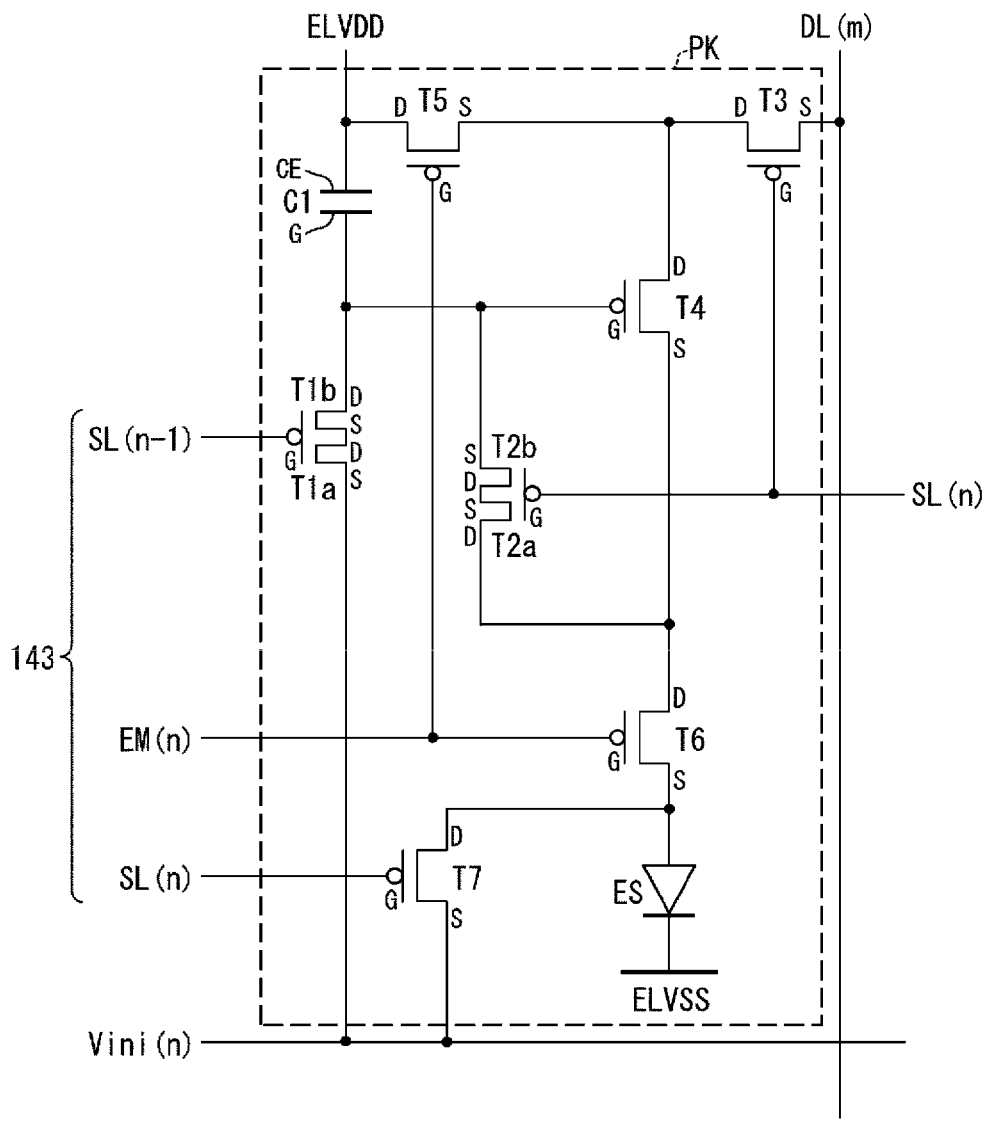
FIG. 2 is a circuit diagram illustrating an example of the subpixel circuit of the display device according to the first embodiment.

FIG. 2 is a circuit diagram illustrating an example of the subpixel circuit PK of the display device 1 according to the present embodiment. Note that the subpixel circuit PK illustrated in FIG. 2 illustrates the pixel circuit PK in the n-th row and m-th column.

The subpixel circuit PK illustrated in FIG. 2 includes one light-emitting element ES, nine thin film transistors (first thin film transistor T1a, T1b, second thin film transistor T2a, T2b, and third thin film transistor T3 to seventh thin film transistor T7), and one capacitor C1. The capacitor C1 is a capacitance element including two electrodes (gate electrode G and capacitance electrode CE).

The first thin film transistors T1a. T1b are first initialization transistors. The second thin film transistors T2a, T2b are threshold value compensation transistors. Note that the first thin film transistor Tia and the first thin film transistor T1b are connected in series. Further, the second thin film transistor T2a and the second thin film transistor T2b are connected in series. The first thin film transistor T1a and the first thin film transistor T1b include the gate electrode G common thereto. The second thin film transistor T2a and the second thin film transistor T2b include the gate electrode G common thereto. The third thin film transistor T3 is a writing control transistor. The fourth thin film transistor T4 is a drive transistor. The fifth thin film transistor T5 is a power supply control transistor. The sixth thin film transistors T6 is a light emission control transistor. The seventh thin film transistor T7 is a second initialization transistor.

The gate electrode G (gate terminal) of the first thin film transistor T1a and the first thin film transistor T1b is connected to the scanning signal line SL (n–1) of a front stage (n–1-th row). The drain electrode D (drain terminal) of the first thin film transistor T1a is connected to the source electrode S of the first thin film transistor T1b. The source electrode S (source terminal) of the first thin film transistor T1a is connected to the initialization potential line Vini (n) of its own stage (n-th row). The drain electrode D of the first thin film transistor T1b is connected to the gate electrode serving as one electrode of the capacitor C1, the source electrode S of the second thin film transistor T2b, and the gate electrode G of the fourth thin film transistor T4.

The gate electrode G of the second thin film transistor T2a and the second thin film transistor T2b is connected to the gate electrode G of the third thin film transistor T3 and the scanning signal line SL (n-th row) of its own stage (n-th row). The drain electrode D of the second thin film transistor T2a is connected to the source electrode S of the fourth thin film transistor T4 and the drain electrode D of the sixth thin film transistor T6. The source electrode S of the second thin film transistor T2a is connected to the drain electrode D of the second thin film transistor T2b. The source electrode S of the second thin film transistor T2b is connected to the drain electrode D of the first thin film transistor T1b, the gate electrode G of the fourth thin film transistor T4, and the above-described one electrode of the capacitor C1.

The gate electrode G of the third thin film transistor T3 is connected to gate electrode G of the second thin film transistor T2a and the second thin film transistor T2b and the scanning signal line SL (n-th row) of its own stage (n-th row). The source electrode S of the third thin film transistor T3 is connected to the data signal line DL (m) of its own stage (m-th column). The drain electrode D of the third thin film transistor T3 is connected to the drain electrode D of the fourth thin film transistor T4 and the source electrode S of the fifth thin film transistor T5.

The gate electrode G of the fourth thin film transistor T4 is connected to the source electrode S of the second thin film transistor T2b, the drain electrode D of the first thin film transistor T1b, and the one electrode described above of the capacitor C1. The drain electrode D of the fourth thin film transistor T4 is connected to the drain electrode D of the third thin film transistor T3 and the source electrode S of the fifth thin film transistor T5. The source electrode S of the fourth thin film transistor T4 is connected to the drain electrode D of the sixth thin film transistor T6 and the drain electrode D of the second thin film transistor T2a.

The gate electrode G of the fifth thin film transistor T5 is connected to the light emission control line EM (n) of its own stage (n-th line) and the gate electrode G of the sixth thin film transistor T6. The drain electrode D of the fifth thin film transistor T5 is connected to the high-level power source line ELVDD and the capacitance electrode CE serving as the other electrode of the capacitor C1. The source electrode S of the fifth thin film transistor T5 is connected to the drain electrode D of the fourth thin film transistor T4 and the drain electrode D of the third thin film transistor T3.

The gate electrode G of the sixth thin film transistor T6 is connected to the light emission control line EM (n) of its own stage (n-th row) and the gate electrode G of the fifth thin film transistor T5. The drain electrode D of the sixth thin film transistor T6 is connected to the drain electrode D of the second thin film transistor T2a and the source electrode S of the fourth thin film transistor T4. The source electrode S of the sixth thin film transistor T6 is connected to the drain electrode D of the seventh thin film transistor T7 and the first electrode 51 of the light-emitting element ES.

The gate electrode G of the seventh thin film transistor T7 is connected to the scanning signal line ST (n) of its own stage (n-th row). The drain electrode D of the seventh thin film transistor T7 is connected to the source electrode S of the sixth thin film transistor T6 and the first electrode 51 of the light-emitting element ES. The source electrode S of the seventh thin film transistor T7 is connected to the initialization potential line Vini (n) of its own stage (n-th row).

Figure 1:
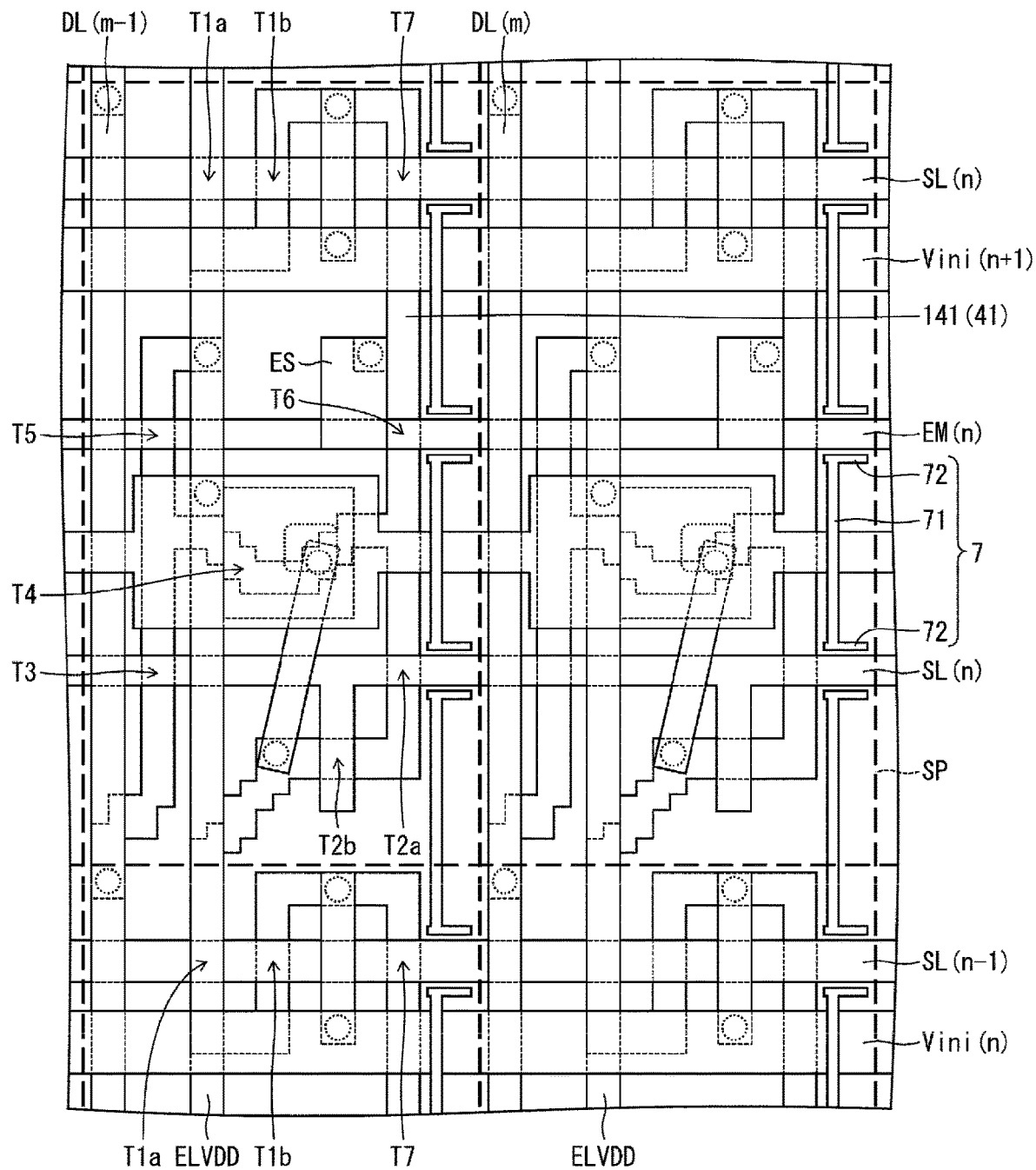
FIG. 1 is a plan view illustrating an example of a subpixel circuit of a display device according to a first embodiment.

FIG. 1 is a plan view illustrating an example of the subpixel circuit PK of the display device 1 according to the present embodiment.

As illustrated in FIG. 1, the semiconductor layer 41 includes a plurality of the coupling semiconductor layers 141. In the display region DA, each coupling semiconductor layer 141, in a plan view, intersects the control lines 143, such as the scanning signal line SL and the light emission control line EM, and extends in the column direction (vertical direction in FIG. 1) across the plurality of subpixels SP in the column direction.

Respective portions of each coupling semiconductor layer 141 provided to each subpixel SP constitute the plurality of thin film transistors described above and couple each thin film transistor, Further, as illustrated in FIG. 1 and FIG. 4, in a plan view, a plurality of grooves 7 formed between adjacent control lines 143 and spaced apart from these control lines 143 by removal of the gate insulating film 42 are provided in the gate insulating film 42. As illustrated in FIG. 1, the groove 7 includes a first groove 71 and second grooves 72. As illustrated in FIG. 4, an inside of the groove 7 is covered by the first interlayer insulating film 44.

As illustrated in FIG. 1, each of the first grooves 71 extends in the column direction along the coupling semiconductor layer 141 between the adjacent control lines 143, in a plan view. As illustrated in FIG. 1 and FIG. 4, in a plan view, the first groove 71 is provided in the vicinity of the coupling semiconductor layer 141 (that is, in the, vicinity of an edge portion of the coupling semiconductor layer 141), spaced apart from the coupling semiconductor layer 141, and thus is adjacent to the coupling semiconductor layer 141. Each of the second grooves 72 extends in a direction intersecting the first groove 71, and thus is adjacent to at least one end portion of the first groove 71.

FIG. 1 illustrates an example of a case in which the second grooves 72 extend in the row direction (horizontal direction in FIG. 1) orthogonal to the first groove 71, and thus the first groove 71 and the second grooves 72 are coupled at the respective end portions of the first groove portions 71 in T-shapes. Note that, in the present embodiment, a T-shape refers to a shape in which an end portion of the first groove 71 is connected to a portion between one end portion and the other end portion of the second groove 72, Therefore, in the present embodiment, the groove 7 having an I-shape is formed in which the second grooves 72 are respectively coupled to both end portions of the first groove 71, between the adjacent control lines 143 in the gate insulating film 42, in a plan view.

The first groove 71 serves as an occurrence origin of a crack CR (refer to FIG. 5 and FIG. 6) caused by stress concentration, and functions as a crack-guiding pattern that guides the crack CR to the second grooves 72. The second grooves 72 function as crack stoppers that stop the progression (propagation) of the crack CR.

Figure 5:
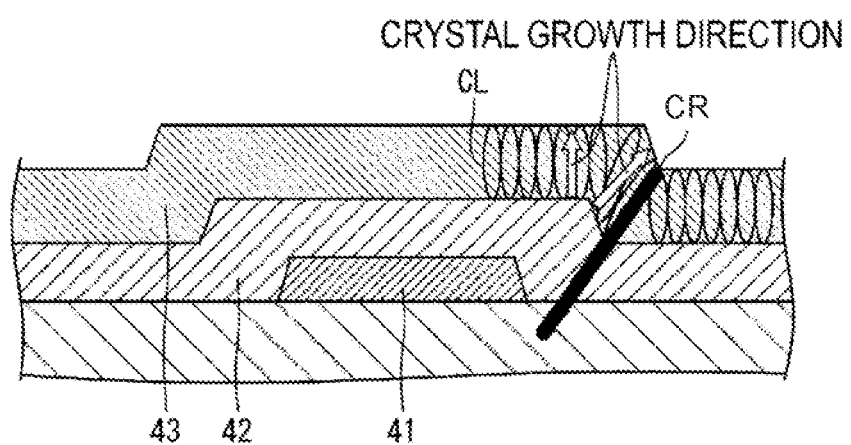
FIG. 5 is a cross-sectional view for describing a cause of occurrence of a crack.
Figure 6:
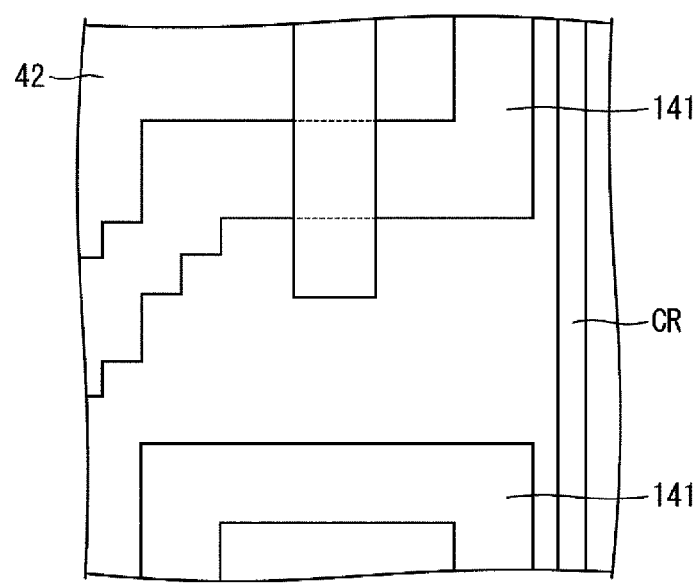
FIG. 6 is a plan view for describing how a crack progresses at a bending portion of a coupling semiconductor layer, after formation of a first wiring line.

FIG. 5 is a cross-sectional view for describing a cause of occurrence of the crack CR. FIG. 6 is a plan view for describing how the crack CR progresses at a bending portion of the coupling semiconductor layer 141, after formation of the first wiring line 43. Note that FIG. 6 illustrates a display device not provided with the groove 7 as an example and, for the sake of convenience of description, constituent elements having the same functions as the constituent elements in the display device 1 according to the present embodiment are denoted by the same reference signs.

As illustrated in FIG. 5, when the groove 7 is not provided, the crack CR occurs due to the step of the semiconductor layer 41. Stress generally increases locally at a shape changing portion of an object.

As illustrated in FIG. 5, the first wiring line 43 intersects the semiconductor layer 41 with the gate insulating film 42 interposed therebetween. Therefore, as illustrated in FIG. 5, the gate insulating film 42 includes, along the semiconductor layer 41, a step portion caused by the step of the semiconductor layer 41. Further, the first wiring line 43, in a portion overlapping the edge portion of the semiconductor layer 41, in a plan view, includes a step portion caused by the step of the semiconductor layer 41 and the gate insulating film 42. Such a step portion is likely to become an origin of crack occurrence due to stress concentration. Further, in the step portion described above of the first wiring line 43, a growth direction of crystal CL of a substance constituting the first wiring line changes, making the step portion susceptible to stress. Therefore, after formation of the first wiring line 43, in a plan view, the crack CR occurs at the edge portion of the coupling semiconductor layer 141 (specifically, the step portion of the control line 143 serving as the first wiring line 43 intersecting the coupling semiconductor layer 141, and the step portion of the gate insulating film 42 immediately below that step portion), causing the control line 143 to readily break.

As illustrated in FIG. 6, in the gate insulating film 42, the crack CR progresses (extends) along the coupling semiconductor layer 141 in parallel with an extending direction (that is, column direction) of the coupling semiconductor layer 141, which is a longitudinal direction. In other words, the crack CR progresses (extends) along the step portion along the coupling semiconductor layer 141 in the gate insulating film 42. However, at the portion where the coupling semiconductor layer 141 bends, the crack CR does not progress along the coupling semiconductor layer 141 that bends. That is, the crack CR does not progress in the direction intersecting the column direction and stops progressing at the portion where the coupling semiconductor layer 141 is interrupted in the column direction. However, as illustrated in FIG. 6, when another coupling semiconductor layer 141 spaced apart from the coupling semiconductor layer 141 is present in the vicinity of the bend of the coupling semiconductor layer 141, the crack CR progresses, continuing along each coupling semiconductor layer 141.

As described above, the coupling semiconductor layer 141 extends in the column direction across the plurality of subpixels SP in the column direction. The coupling semiconductor layer 141 intersects a plurality of the control lines 143, such as the scanning signal lines SL and the light emission control lines EM, extending in the row direction. Therefore, when the crack CR occurs even at any one of the step portions described above, the occurring crack CR extends (propagates) along the coupling semiconductor layer 141 in the gate insulating film 42. Then, this extending crack CR reaches an area immediately below the control line 143, causing the control line 143 (first wiring line 43) to readily break due to the crack CR. As described above, the coupling semiconductor layer 141 is provided across the plurality of subpixels SP in the column direction and thus, when the crack CR occurs in any one of the step portions described above, a break may occur in the control line 143 in the plurality of pixels.

Stress is likely to concentrate in a portion having a more significant shape change. When the first groove 71 described above is provided in the gate insulating film 42, stress concentrates to a greater degree at the first groove 71 than at the edge portion of the coupling semiconductor layer 141. As described above, the first groove 71 is provided in the vicinity of the coupling semiconductor layer 141, adjacent to the coupling semiconductor layer 141. The crack CR originates at a portion where the stress is most concentrated, and does not originate at a plurality of locations close in distance.

Thus, according to the present embodiment, in a case in which the crack CR occurs, the crack CR selectively occurs at the first groove 71. In other words, the crack CR is less likely to occur at the edge portion of the coupling semiconductor layer 141. Therefore, by providing the groove 7, it is possible to prevent the control line 143 intersecting the coupling semiconductor layer 141 from breaking at the edge portion of the coupling semiconductor layer 141.

Further, the crack CR that occurs at the first groove 71 propagates through the first groove 71 and is guided to the second groove 72, and thus the progression (propagation) is stopped by the second groove 72. In a plan view, the groove 7 is provided between the adjacent control lines 143, spaced apart from the control lines 143, in the gate insulating film 42, and does not intersect the control lines 143. Thus, according to the present embodiment, it is possible to prevent the progression of the crack CR from causing a new break to occur in the control lines 143 in the progressing direction of the crack CR. Therefore, according to the present embodiment, it is possible to provide the display device 1 that can prevent breakage of the control line 143 caused by progression of the crack CR.

As long as the first groove 71 is provided along the coupling semiconductor layer 141 between the adjacent control lines 143 in a plan view as described above, a length thereof is not particularly limited. Note that the length of the first groove 71 refers to a length from one end portion to the other end portion of the first groove 71 in the column direction, which is the extending direction thereof. However, as described above, the crack CR progresses along the coupling semiconductor layer 141. Then, even if there is a portion where the coupling semiconductor layer 141 is interrupted in the column direction, as long as the coupling semiconductor layer 141 is formed intermittently in the column direction, the crack CR progresses in the column direction, even in the portion where the coupling semiconductor layer 141 is interrupted.

Therefore, desirably the first groove 71 is formed to a length at which the second groove portions 72, at the end portions in the extending direction of the first groove 71, are adjacent to the control lines 143 in a plan view. Accordingly, desirably the second grooves 72 are provided in the vicinity of the control lines 143, adjacent to the control lines 143.

Note that, as described above, the crack CR does not progress in the direction intersecting the column direction. Therefore, as long as the second grooves 72 are provided intersecting the first groove 71, the lengths thereof are not particularly limited. However, desirably the lengths of the second grooves 72 are longer than a width (line width) of the first groove 71. Therefore, the lengths of the second grooves 72 are desirably 5 µm or greater. Note that the length of the second groove 72 refers to a length from one end portion to the other end portion of the second groove 72 in the extending direction (row direction in the present embodiment) of the second groove 72.

The occurrence and propagation of the crack CR are not affected by the widths of the first groove 71 and the second grooves 72. Note that the width of the first groove 71 refers to a length from one end portion to the other end portion of the first groove 71 in a direction orthogonal to the extending direction of the first groove 71 (in other words, in a short-hand direction of the first groove 71), in a plan view. Similarly, the width of the second groove 72 refers to a length from one end portion to the other end portion of the second groove 72 in a direction orthogonal to the extending direction of the second groove 72 (in other words, in a short-hand direction of the second groove 72), in a plan view. Therefore, the widths of the first groove 71 and the second grooves 72 are not particularly limited. However, the first groove 71 and the second grooves 72, being provided in each subpixel SP, are restricted in terms of space. Thus, the widths of the first groove 71 and the second grooves 72 are preferably 5 µm or less. Further, due to problems related to a resolution of exposure when forming the first groove 71 and the second grooves 72, desirably the widths of the first groove 71 and the second grooves 72 are 2 µm or greater.

Figure 7:
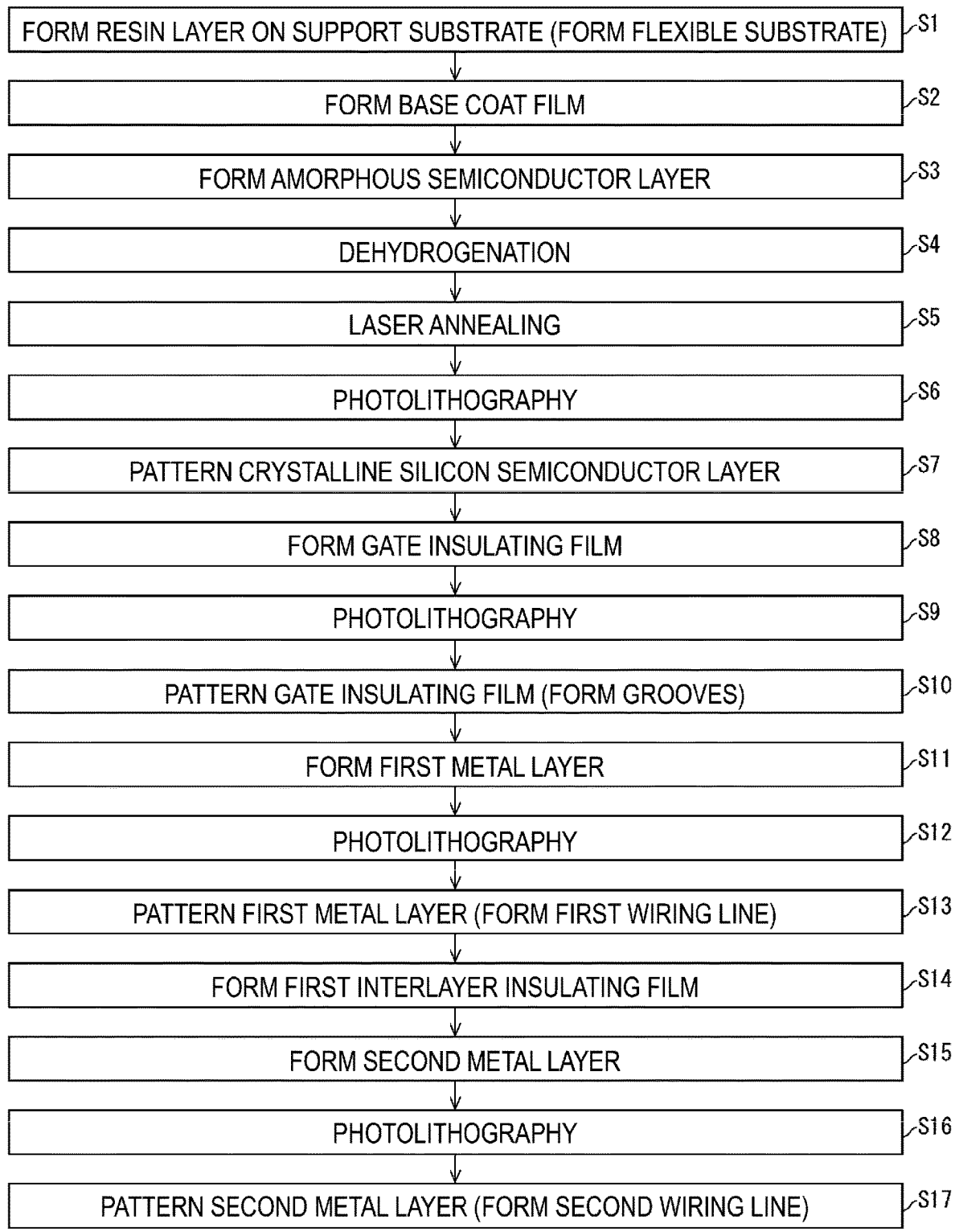
FIG. 7 is a flowchart illustrating, in order, a portion of a manufacturing process of the display device according to the first embodiment.
Figure 8:
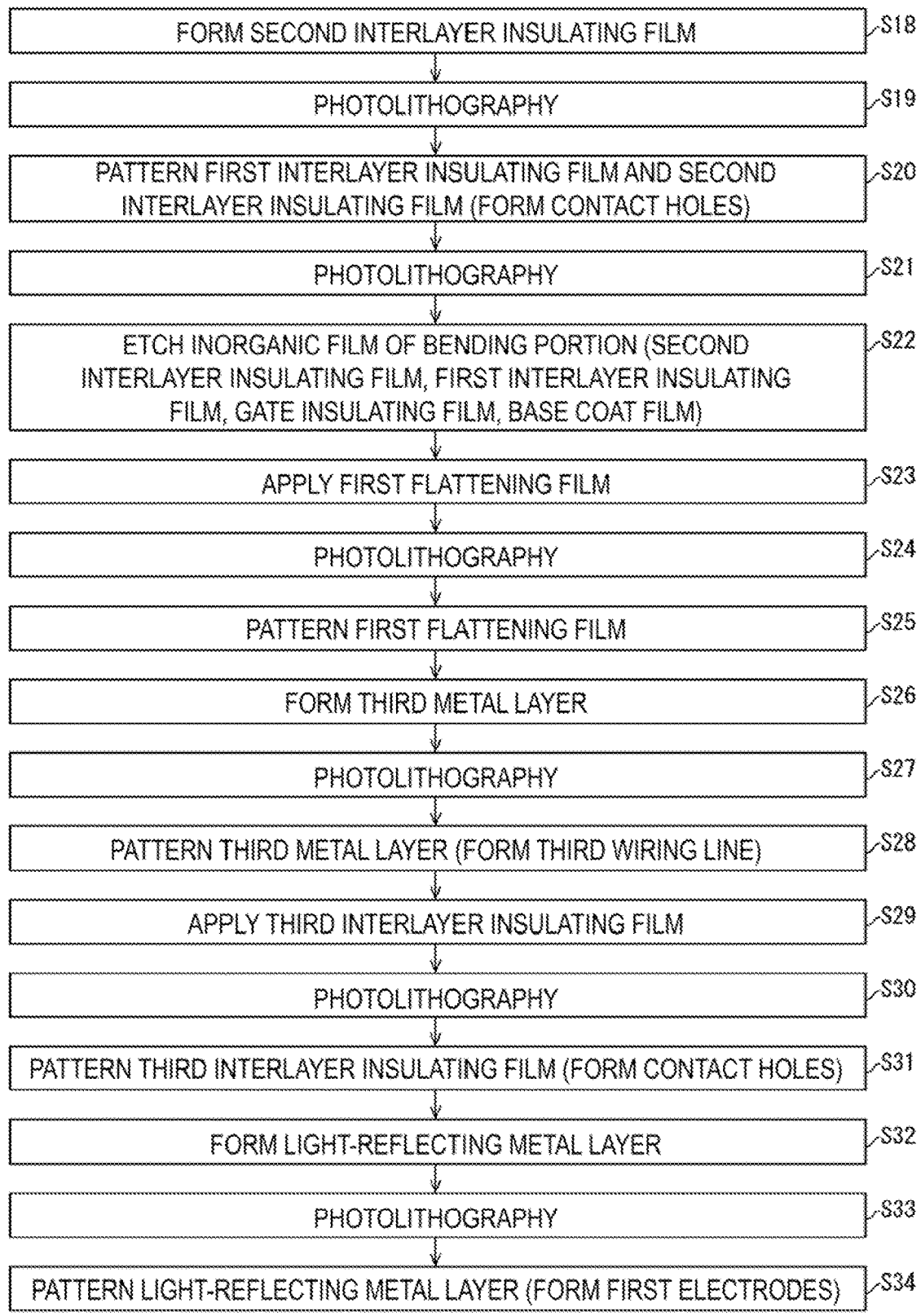
FIG. 8 is another flowchart illustrating, in order, a portion of the manufacturing process of the display device according to the first embodiment.
Figure 9:
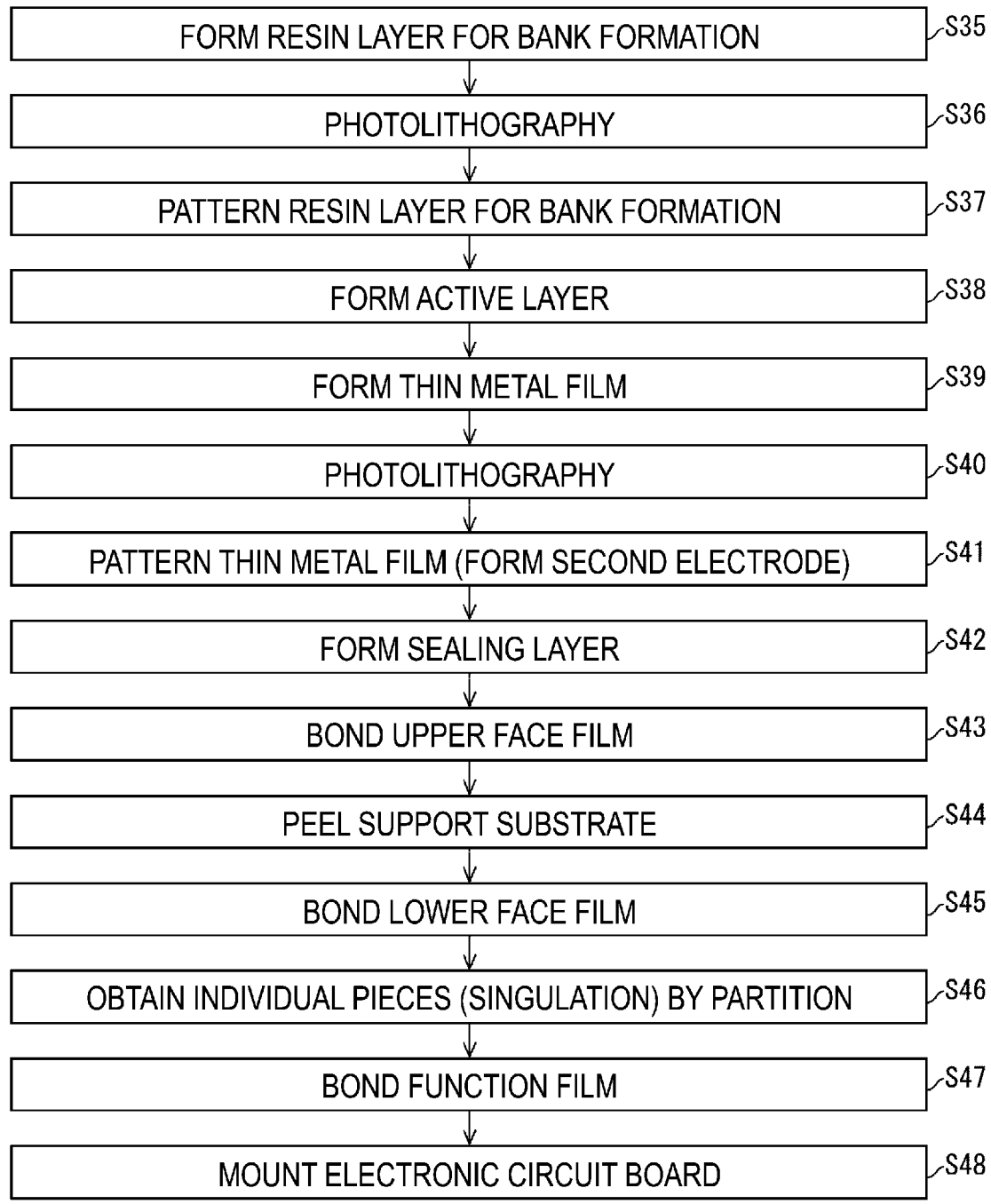
FIG. 9 is yet another flowchart illustrating, in order, a portion of the manufacturing process of the display device according to the first embodiment.

FIG. 7 to FIG. 9 are flowcharts illustrating, in order, portions of a manufacturing process of the display device 1 according to the present embodiment. FIG. 8 illustrates the manufacturing process after the manufacturing process illustrated in FIG. 7. FIG. 9 illustrates the manufacturing process after the manufacturing process illustrated in FIG. 8.

When the flexible display device 1 is manufactured as illustrated in FIG. 4, first, the resin layer 22 is formed as a substrate (flexible substrate) by applying a polyimide (PI), for example, on a support substrate (mother glass, for example) that is transparent, as illustrated in FIG. 7 (step S1). Next, the base coat film 3 is formed on the resin layer 22 (step S2).

Then, an amorphous semiconductor layer is formed on the base coat film 3 (step S3) and, after dehydrogenation (step S4), laser annealing is performed (step S5). As a result, a crystalline silicon semiconductor layer is formed. Subsequently, photolithography is performed (step S6), and the crystalline silicon semiconductor layer is patterned (step S7). In step S6, a resist film having a predetermined pattern is formed on the crystalline silicon semiconductor layer. In step S7, the crystalline silicon semiconductor layer is patterned using the resist film formed in step S6. This forms the semiconductor layer 41 including the coupling semiconductor layer 141.

Next, the gate insulating film 42 is formed on the base coat film 3, covering the semiconductor layer 41 (step S8). Subsequently, photolithography is performed (step S9), and the gate insulating film 42 is patterned (step S10). In step S8, a resist film having a predetermined pattern is formed on the gate insulating film 42. In step S9, the gate insulating film 42 is patterned using the resist film formed in step S8, forming the grooves 7. At this time, for example, only the gate insulating film 42 in the formation region of the grooves 7 can be etched (removed) by using different materials for the gate insulating film 42 and the base coat film 3 and using an etching solution that etches the gate insulating film 42 but does not etch the base coat film 3 (or is less likely to etch the base coat film 3 compared to the gate insulating film 42). Specifically, for example, an etching amount of the base coat film 3 can be reduced to a certain extent by forming the gate insulating film 42 using silicon oxide ($SiO_2$) and forming the base coat film 3 using silicon oxynitride (SiON). Further, in this case, only the gate insulating film 42 in the formation region of the grooves 7 can be etched by monitoring the light emission during dry etching and stopping the etching when light emission of the nitrogen is detected.

Next, the first metal layer is formed on the gate insulating film 42 (step S11). Subsequently, photolithography is performed (step S12), and the first metal layer is patterned (step S13). In step S12, a resist film having a predetermined pattern is formed on the first metal layer. In step S13, the resist film formed in step S12 is used to pattern the first metal layer, thereby forming the first wiring line 43 including the control lines 143.

Then, the first interlayer insulating film 44 is formed on the gate insulating film 42, covering the first wiring line 43 (step S14). Subsequently, the second metal layer is formed on the first interlayer insulating film 44 (step S15). Subsequently, photolithography is performed (step S16), and the second metal layer is patterned (step S17). In step S16, a resist film having a predetermined pattern is formed on the second metal layer. In step S17, the resist film formed in step S16 is used to pattern the second metal layer, thereby forming the second wiring line 45.

Next, as illustrated in FIG. 8, the second interlayer insulating film 46 is formed on the first interlayer insulating film 44, covering the second wiring line 45 (step S18). Subsequently, photolithography is performed (step S19), and the first interlayer insulating film 44 and the second interlayer insulating film 46 are patterned (step S20). In step S19, a resist film having a predetermined pattern is formed on the second interlayer insulating film 46. In step S20, the first interlayer insulating film 44 and the second interlayer insulating film 46 are patterned using the resist film formed in step S19. Thus, contact holes for forming the source electrodes S and the drain electrodes D are formed in the first interlayer insulating film 44 and the second interlayer insulating film 46. Note that, at this time, the contact holes for forming the source electrodes S and the drain electrodes D in the gate insulating film 42 may be formed together with the first interlayer insulating film 44 and the second interlayer insulating film 46 by using the resist film formed in step S19.

Next, photolithography is performed (step S21), and the inorganic film of the bending portion ZS (second interlayer insulating film 46, first interlayer insulating film 44, the gate insulating film 42, and base coat film 3) is etched and removed (step S22). Thus, as illustrated in FIG. 3, a groove MS is formed in the bending portion ZS.

Next, a first flattening film that flattens the bending portion ZS is formed (step S23). Then, photolithography is performed (step S24), and the first flattening film is patterned (step S25). In step S24, a resist film having a predetermined pattern is formed on the first flattening film. In step S25, the first flattening film is patterned using the resist film formed in step 824. At this time, the first flattening film in the subpixels SP of the display region DA is removed while remaining only in the groove MS of the bending portion ZS illustrated in FIG. 3, thereby forming a filling layer (not illustrated) composed of the first flattening film in the groove MS of the bending portion ZS.

Then, the third metal layer is formed (step S26). Subsequently, photolithography is performed (step S27), and the third metal layer is patterned (step S28). In step S27, a resist film having a predetermined pattern is formed on the third metal layer. In step S28, the third wiring line 47 is formed by patterning the third metal layer using the resist film formed in step 827.

Next, the third interlayer insulating film 48 is formed, covering the third wiring line 47 (step S29). Then, photolithography is performed (step S30), and the third interlayer insulating film 48 is patterned (step S31). In step S30, a resist film having a predetermined pattern is formed on the third interlayer insulating film 48. In step S31, the third interlayer insulating film 48 is patterned using the resist film formed in step S30. Thus, the contact holes provided in the thin film transistor layer 4 and configured to connect the first electrode 51 in the light-emitting element layer 5 to the sixth thin film transistor T6 and the seventh thin film transistor T7 illustrated in FIG. 1 and FIG. 2, and the contact hole provided in the thin film transistor layer 4 and configured to connect the second electrode 54 to the low-level power source line are formed in the third interlayer insulating film 48.

Then, a light-reflecting metal layer for forming the first electrode 51 is formed on the third interlayer insulating film 48 (step S32). Then, photolithography is performed (step S33), and the light-reflecting metal layer is patterned (step S34). In step S33, a resist film having a predetermined pattern is formed on the light-reflecting metal layer. In step S34, the light-reflecting metal layer is patterned using the resist film formed in step S33, thereby forming a light-reflecting electrode as the first electrode 51.

Next, as illustrated in FIG. 9, a resin layer for bank formation is formed on the third interlayer insulating film 48, covering the first electrode 51 (step S35). Then, photolithography is performed (step S36), and the resin layer for bank formation is patterned (step S37). In step S36, a resist film having a predetermined pattern is formed on the resin layer for bank formation. In step S37, the banks 52 are formed by patterning the resin layer for bank formation using the resist film formed in step S36.

Next, the active layer 53 is formed (step S38). Various known methods for forming an active layer can be used for formation of the active layer 53. For example, to form the light-emitting layer of the active layer 53, vapor deposition, a printing method, an ink-jet method, a spin coating method, a casting method, a dipping method, a bar coating method, a blade coating method, a roll coating method, a gravure coating method, a flexographic printing method, a spray coating method, a photolithography method, and a self-organization method (alternating adsorption method, self-organized monolayer method) can be used. Further, to form the active layers other than the light-emitting layer, a sputtering method, a nanoparticle application method, a precursor coating method, a vapor deposition method, a printing method, an ink-jet method, and the like can be used.

Then, a thin metal film for forming the second electrode 54 is formed, covering the active layer 53 (step S39). Then, photolithography is performed (step S40), and the thin metal film is patterned (step S41). In step S40, a resist film having a predetermined pattern is formed on the thin metal film. In step S41, the thin metal film is patterned using the resist film formed in step S40, thereby forming a semitransparent electrode as the second electrode 54 in the display region DA and in a portion of the frame region NDA.

Next, the sealing layer 6 is formed (step S42). As described above, the inorganic sealing film 61 and the inorganic sealing film 63 are formed by, for example, CVD, and the organic buffer film 62 can be formed by, for example, ink-jet application.

Next, an upper face film is bonded on the sealing layer 6 (step S43). Next, the support substrate is peeled from the resin layer 22 by irradiation with a laser light or the like (step S44). Next, the lower face film 21 is bonded to the lower face of the resin layer 22 (step S45). Next, a layered body including the lower face film 21, the resin layer 22, the base coat film 3, the thin film transistor layer 4, the light-emitting element layer 5, and the sealing layer 6 is partitioned to obtain a plurality of individual pieces (step S46). Next, a function film (not illustrated) is bonded to the obtained individual pieces (step S47). Next, an electronic circuit board (not illustrated) is mounted onto the terminal portion TS of the frame region NDA (step S48). Note that each of the steps S1 to S48 is performed by a display device manufacturing apparatus including a film formation apparatus.

Note that, in FIG. 7 to FIG. 9, a case is illustrated, as an example, in which the display device 1 is a flexible display device. When the display device 1 is a non-flexible display device (in other words, a solid display device), the formation of the resin layer 22, the replacement of the support substrate, and the like are unnecessary. Therefore, in a case in which the display device 1 is a solid display device, the layering process of steps S2 to S42 is performed on a glass substrate, and subsequently the process proceeds to step S46, for example. Furthermore, in the case of manufacture of the solid display device 1, a light-transmitting sealing member may be adhered by using a sealing adhesive under a nitrogen atmosphere, instead of or in addition to forming the sealing layer 6. The light-transmitting sealing member can be formed from glass, plastic, or the like, and preferably has a concave shape.

Modified Example 1

FIG. 1 illustrates as an example, a case in which, in a plan view, the groove 7 formed between the adjacent control lines 143 has an I-shape, and the first groove 71 and the second groove 72 are coupled in T-shapes at the end portions of the first groove 71. However, the second groove 72 need only be provided to at least one end portion of the first groove 71. In other words, the first groove 71 and the second groove 72 may be coupled in a T-shape in a plan view at at least one end portion of the first groove 71. Accordingly, each of the grooves 7 formed between the adjacent control lines 143 may itself have a T-shape. Note that, in this case as well, the second groove 72 is desirably provided in the vicinity of the control line 143, adjacent to the control line 143.

Modified Example 2

Figure 10:
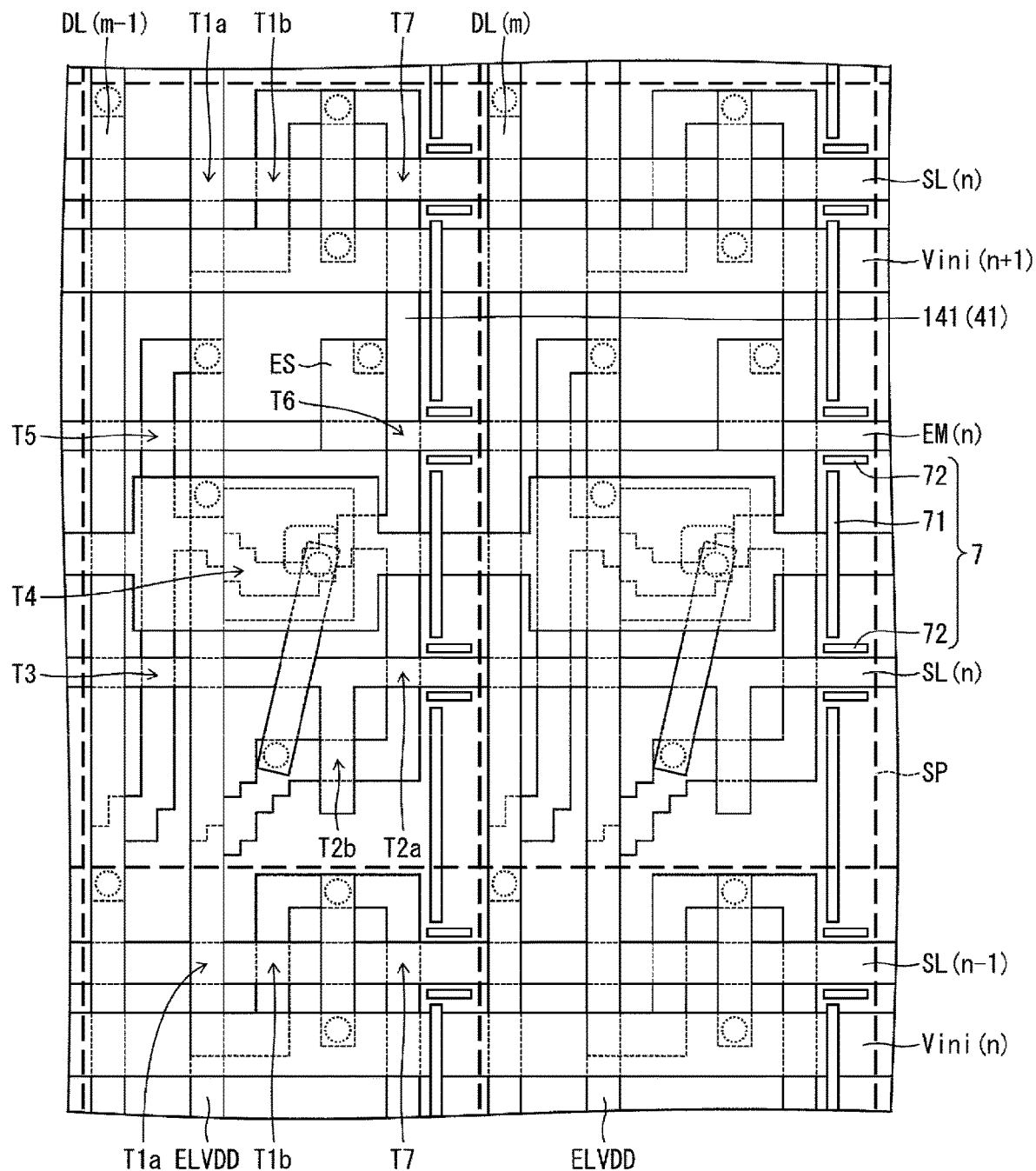
FIG. 10 is a plan view illustrating an example of a subpixel circuit of the display device according to a second modified example of the first embodiment.

FIG. 10 is a plan view illustrating an example of the subpixel circuit PK of the display device 1 according to this modified example.

As illustrated in FIG. 10, the second groove 72 may be spaced apart from the first groove 71, adjacent to the first groove 71. In other words, the second groove 72 may be provided in the vicinity of the end portion of the first groove 71. Note that FIG. 10 illustrates an example of a case in which the second grooves 72 are provided adjacent to both end portions of the first groove 71. However, in this modified example as well, the second groove 72 need only be provided adjacent to at least one end portion of the first groove 71.

Thus, even with a shape in which the first groove 71 and the second groove 72 are not connected, the second groove 72 can be provided adjacent to the first groove 71 in a location where cracks occurs, thereby preventing breakage of the control line 143 (first wiring line 43).

Modified Example 3

Figure 11:
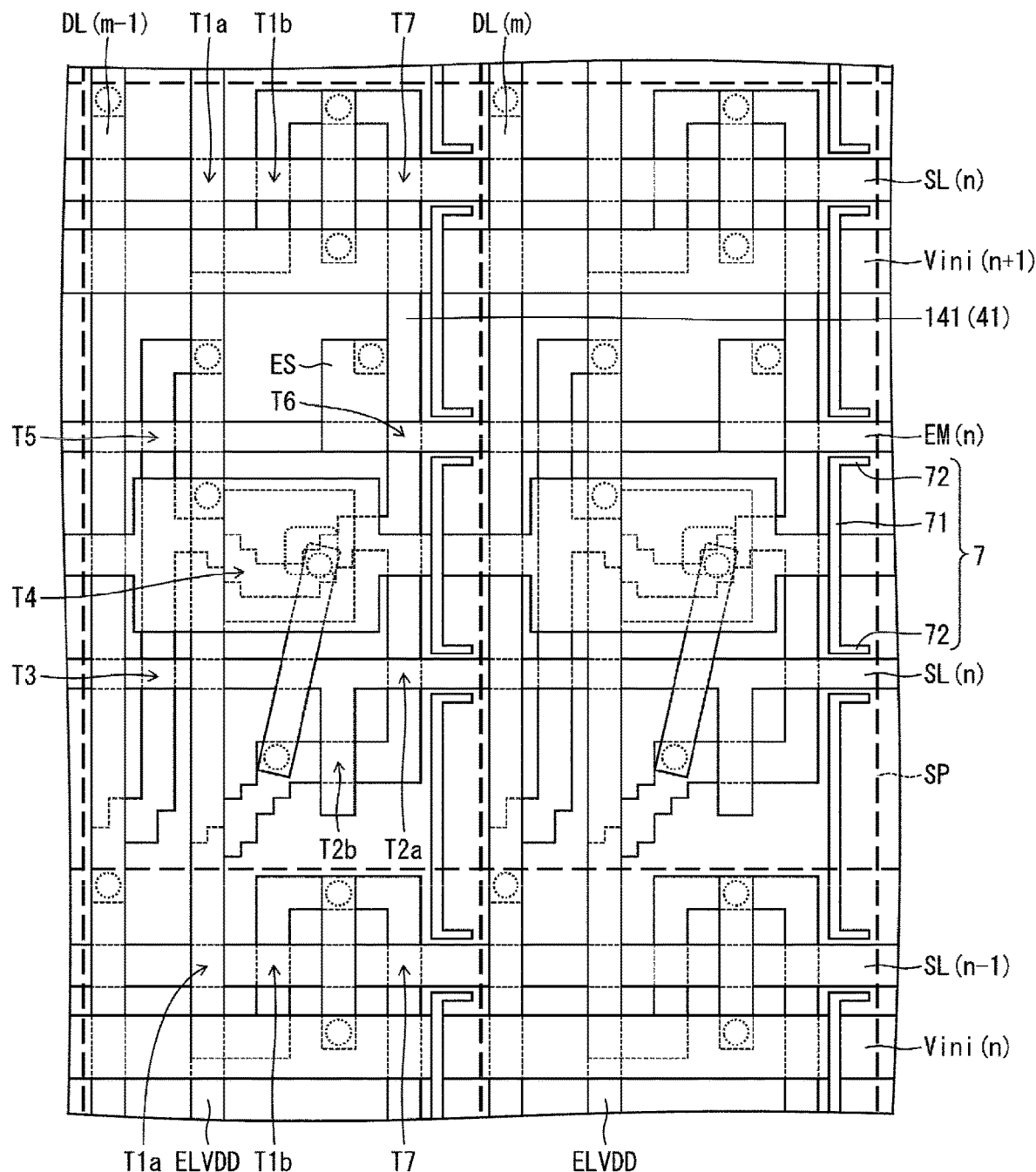
FIG. 11 is a plan view illustrating an example of the subpixel circuit of the display device according to a third modified example of the present embodiment.

FIG. 11 is a plan view illustrating an example of the subpixel circuit PK of the display device 1 according to this modified example.

FIG. 1 and FIG. 10 illustrate examples of cases in which the end portion of the first groove 71 is adjacent to a portion between one end portion and the other end portion of the second groove 72. However, this modified example is not limited thereto and, as illustrated in FIG. 11, the end portion of the first groove 71 may be formed adjacent to one end portion of the second groove 72.

Note that FIG. 11 illustrates an example of a case in which the groove 7 formed between the adjacent control lines 143 has a recessed shape in a plan view, and the first groove 71 and the second groove 72 are coupled in L-shapes at the end portions of the first groove 71, in a plan view. However, in this modified example as well, the second groove 72 need only be provided to at least one end portion of the first groove 71. Further, in this modified example as well, the second groove 72 may be spaced apart from the first groove 71, adjacent to the first groove 71.

Modified Example 4

Further, FIG. 1, FIG. 10, and FIG. 11 illustrate examples of a case in which the second groove 72 extends in the row direction orthogonal to the first groove 71. However, the second groove 72 need only extend in a direction intersecting the first groove 71, and the extending direction of the first groove 71 and the extending direction of the second groove 72 need not necessarily differ by 90°. The groove 7 need only be bent at the end portion of the first groove 71 so as not to intersect the coupling semiconductor layer 141. Further, the groove 7 need only be formed so that the coupling semiconductor layer 141 is not positioned on the extending line of the first groove 71 (on the extending line of the first groove 71 in the vicinity of the intersecting portion of the first groove 71 and the second groove 72).

Modified Example 5

Figure 12:
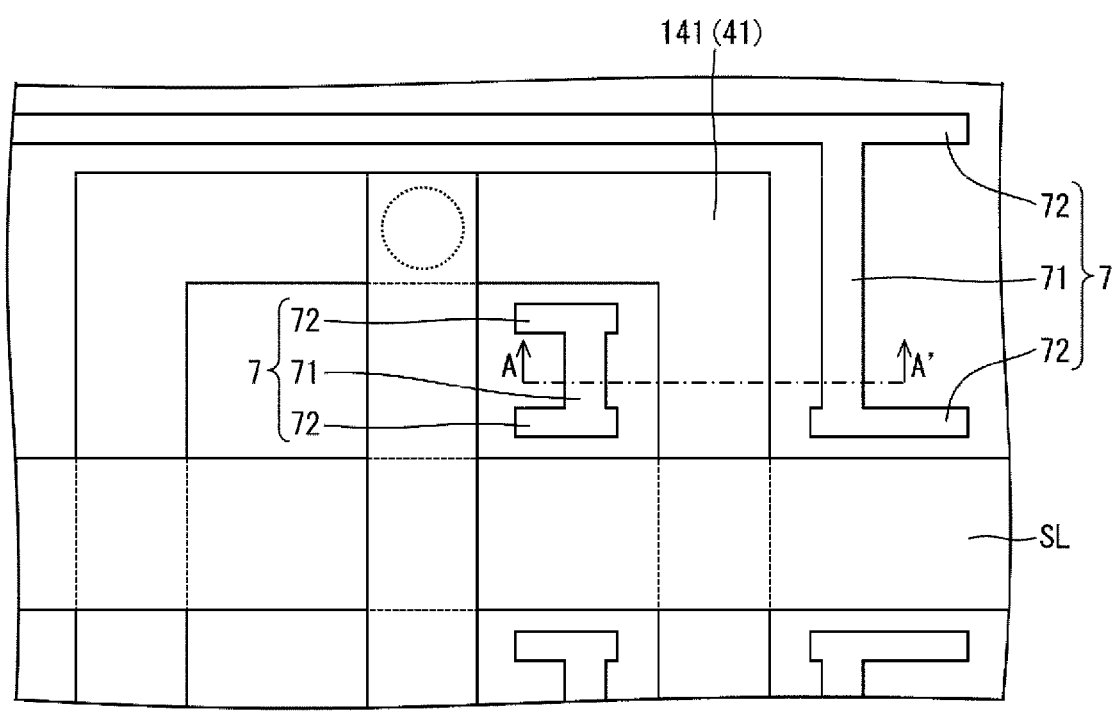
FIG. 12 is a plan view illustrating a schematic configuration of main portions of the subpixel circuit of the display device according to fifth modified example of the first embodiment.
Figure 13:
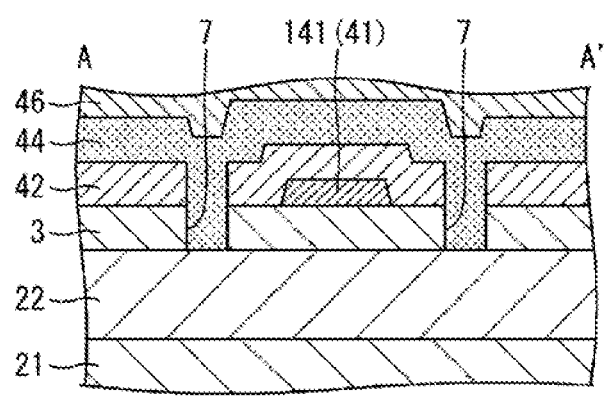
FIG. 13 is a cross-sectional view illustrating a schematic configuration of main portions of the subpixel circuit of the display device according to a fifth modified example of the first embodiment.

FIG. 12 is a plan view illustrating a schematic configuration of main portions of the subpixel circuit PK of the display device 1 according to this modified example. FIG. 13 is a cross-sectional view illustrating a schematic configuration of the main portions of the subpixel circuit PK of the display device 1 according to this modified example.

FIG. 1 FIG. 10, and FIG. 11 illustrate examples in which the groove 7 is provided so that the first grooves 71 are adjacent to each other on one edge portion of the coupling semiconductor layer 141 in the longitudinal direction in a plan view. As described above, the crack CR originates in a portion where the stress is most concentrated, and does not originate at a plurality of locations close in distance. A width (that is, length in a short-hand direction) of the coupling semiconductor layer 141 is generally about several μm. Therefore, as long as the first grooves 71 are provided adjacent to each other in the longitudinal direction of the coupling semiconductor layer 141 on one edge portion in the short-hand direction of the coupling semiconductor layer 141, it can be safely said that occurrences of the crack CR at the other edge portion in the short-hand direction of the coupling semiconductor layer 141 are substantially or simply nonexistent. Therefore, the groove 7 is sufficient as long as the first grooves 71 are provided adjacent to each other along the longitudinal direction of the coupling semiconductor layer 141 on one edge portion in the short-hand direction of the coupling semiconductor layer 141. However, taking all eventualities into consideration, the groove 7 may be provided so that the first grooves 71 are adjacent to each other in the longitudinal direction of the coupling semiconductor layer 141 on both edge portions of the coupling semiconductor layer 141 in the short-hand direction in a plan view, sandwiching the coupling semiconductor layer 141, as illustrated in FIG. 12 and FIG. 13.

Second Embodiment

Differences from the first embodiment will be described in the present embodiment. Note that, for convenience of description, members having the same function as the members described in the first embodiment are designated by the same reference signs, and descriptions thereof are omitted.

Figure 14:
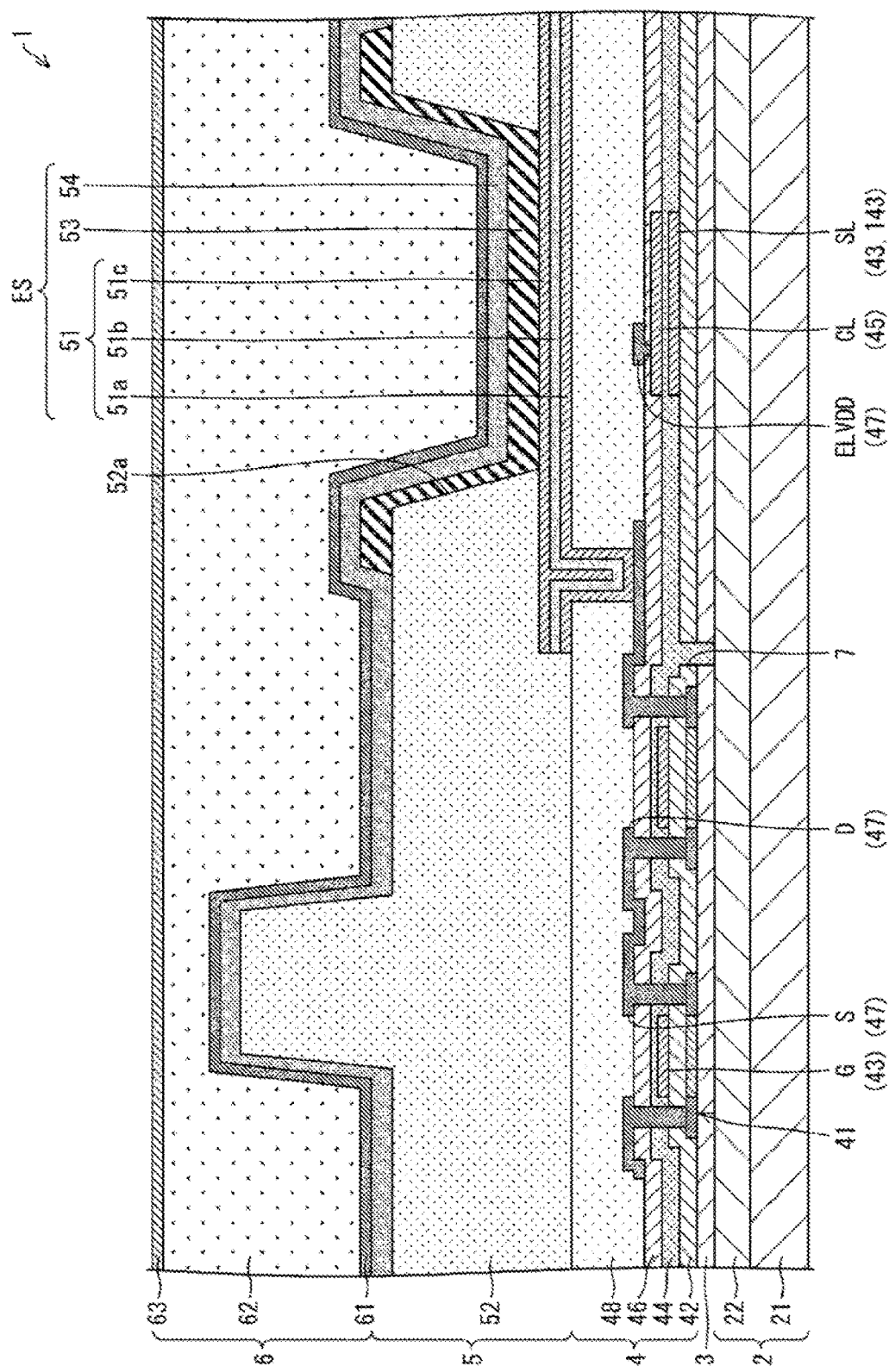
FIG. 14 is a cross-sectional view illustrating a schematic configuration of main portions of the display device according to a second embodiment.
Figure 15:
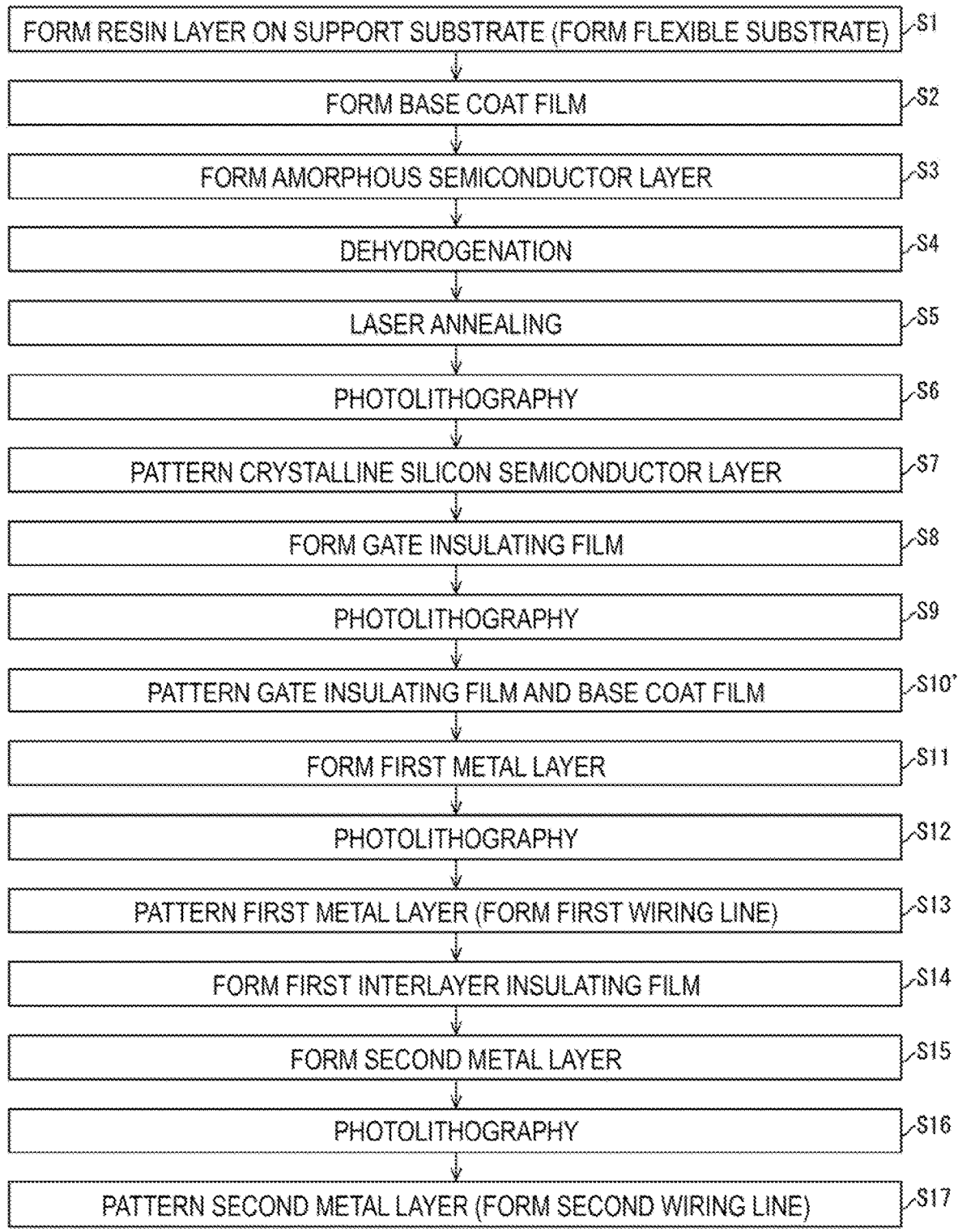
FIG. 15 is a flowchart illustrating, in order, a portion of a manufacturing process of the display device according to the second embodiment.

FIG. 14 is a cross-sectional view illustrating a schematic configuration of main portions of the display device 1 according to the present embodiment. FIG. 15 is a flowchart illustrating, in order, a portion of a manufacturing process of the display device 1 according to the present embodiment.

As illustrated in FIG. 14, the display device 1 according to the present embodiment is the same as the display device 1 according to the first embodiment except that the groove 7 composed of the first groove 71 and the second groove 72 has a depth, from the gate insulating film 42, that reaches the base coat film 3 immediately below the gate insulating film 42. In the present embodiment, the plurality of grooves 7 formed by removing the gate insulating film 42 and the base coat film 3 immediately below the gate insulating film 42 are provided between adjacent control lines 143, in a plan view, in the gate insulating film 42. Note that, as illustrated in FIG. 14, in the present embodiment as well, the inside of the groove 7 is covered by the first interlayer insulating film 44.

Further, a manufacturing method of the display device 1 according to the present embodiment is the same as the manufacturing method of the display device 1 according to the first embodiment except that step S10' illustrated in FIG. 15 is performed instead of step S10 in the first embodiment. In the present embodiment, as illustrated in FIG. 15, after step S1 to step S9 are performed as in the first embodiment, the gate insulating film 42 and the base coat film 3 are patterned using the resist film formed in step S9 to form the grooves 7 (step S10'). In this case, for example, the same material is used for the gate insulating film 42 and the base coat film 3, making it possible to etch (remove) the gate insulating film 42 and the base coat film 3 in the formation region of the grooves 7 together. However, the present embodiment is not limited to the above configuration. The material of the gate insulating film 42 and the material of the base coat film 3 may be the same, or may be different from each other. For example, silicon oxynitride (SiON) is used for the material of the base coat film 3, the light emission during dry etching is monitored, and the etching is stopped when the light emission of nitrogen is no longer detected. This makes it possible to etch only the gate insulating film 42 and the base coat film 3 without etching the resin layer 22.

Next, as illustrated in FIG. 15, step S11 to step S17 are performed as in the first embodiment. Subsequently, step S18 to step S34 illustrated in FIG. 8 are performed, and then step S35 to step S48 illustrated in FIG. 8 are performed, as in the first embodiment. In this manner, the display device 1 according to the present embodiment is manufactured.

As described above, in the present embodiment, as the groove 7, a groove having a depth that reaches the base coat film 3 of a lower layer underlying the gate insulating film 42 is provided. The deeper the depth of the groove 7, the more likely stress concentrates in the groove 7. Thus, according to the present embodiment, the groove 7 is provided in the base coat film 3 of a lower layer underlying the gate insulating film 42 as well, making it possible to guide a crack more reliably than in the first embodiment.

Third Embodiment

Differences from the first and the second embodiments will be described in the present embodiment. Note that, for convenience of description, members having the same function as the members described in the first and second embodiment are designated by the same reference signs, and descriptions thereof will be omitted.

Figure 16:
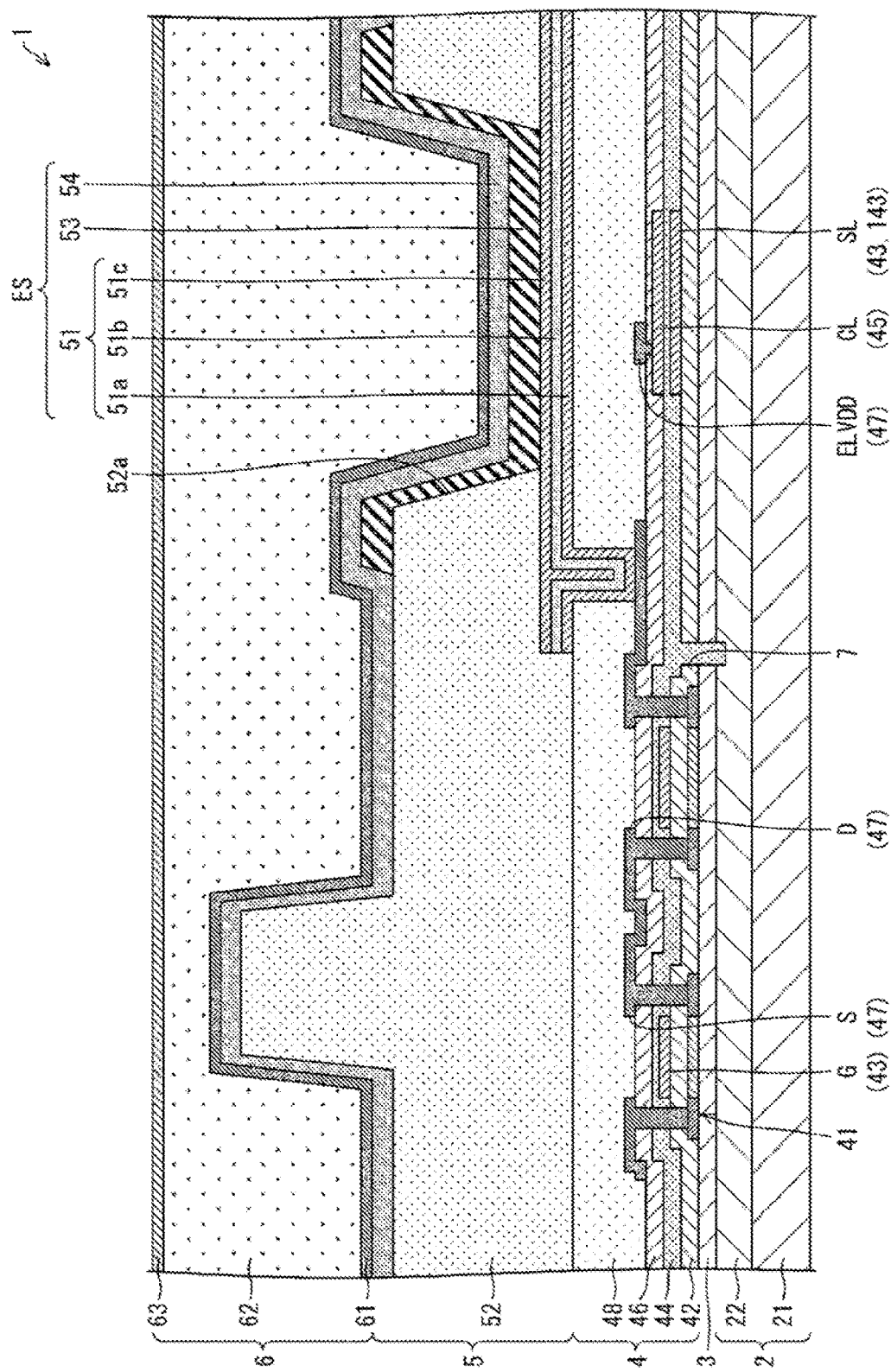
FIG. 16 is a cross-sectional view illustrating a schematic configuration of main portions of the display device according to a third embodiment.
Figure 17:
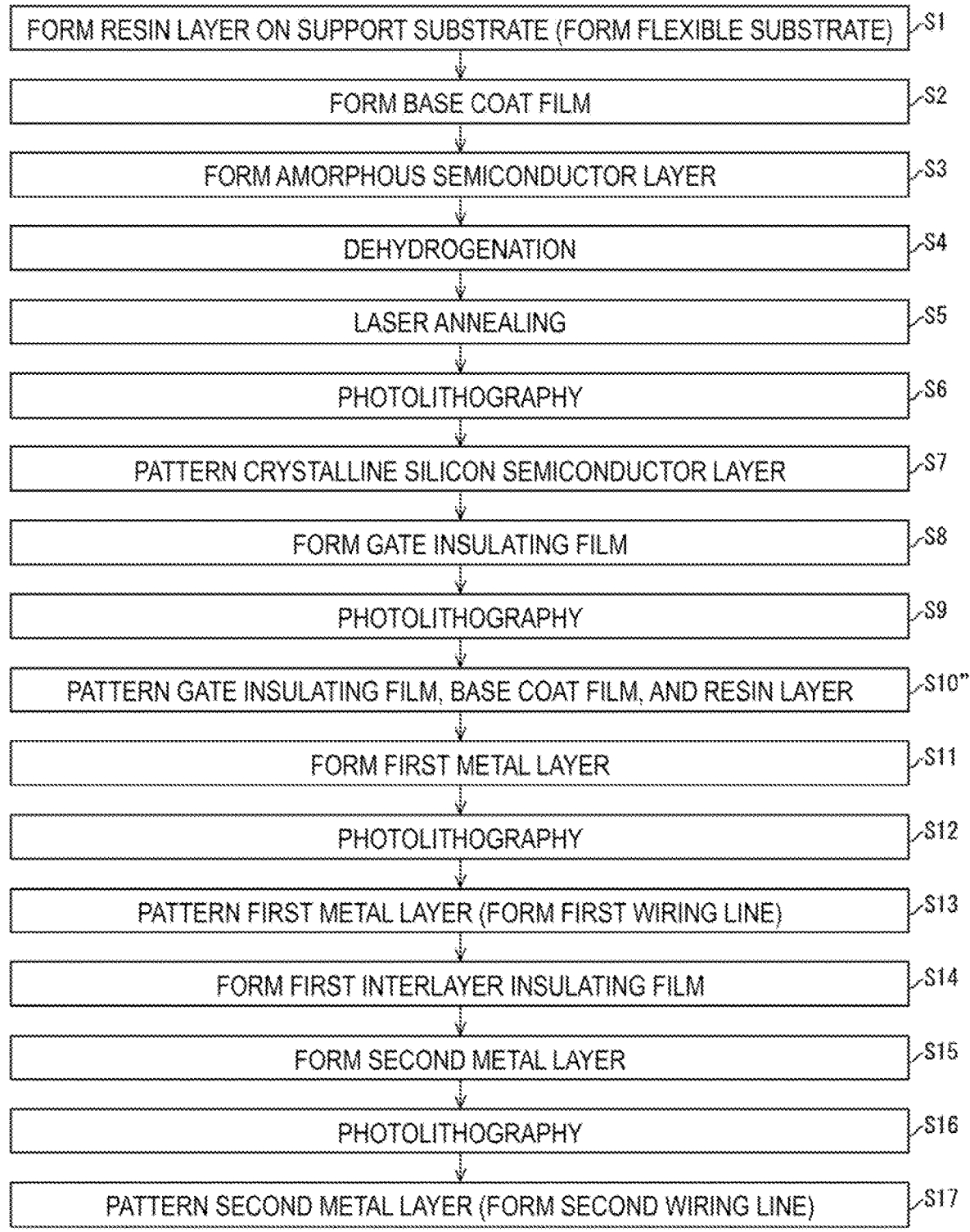
FIG. 17 is a flowchart illustrating a portion of a manufacturing process of the display device according to the third embodiment.

FIG. 16 is a cross-sectional view illustrating a schematic configuration of main portions of the display device 1 according to the present embodiment. FIG. 17 is a flowchart illustrating, in order, a portion of a manufacturing process of the display device 1 according to the present embodiment.

As illustrated in FIG. 16, the display device 1 according to the present embodiment is the same as the display device 1 according to the first and second embodiments except that the groove 7 composed of the first groove 71 and the second groove 72 has a depth, from the gate insulating film 42, that reaches the resin layer 22. In the present embodiment, the plurality of grooves 7 formed by removing portions of the gate insulating film 42, the base coat film 3 immediately below the gate insulating film 42, and the resin layer 22 immediately below the base coat film 3 are provided between adjacent control lines 143, in a plan view, in the gate insulating film 42. Note that, as illustrated in FIG. 16, in the present embodiment as well, the groove 7 is covered by the first interlayer insulating film 44.

Further, a manufacturing method of the display device 1 according to the present embodiment is the same as the manufacturing method of the display device 1 according to the first embodiment except that step S10" illustrated in FIG. 17 is performed instead of step S10 in the first embodiment. In the present embodiment, as illustrated in FIG. 17, after step S1 to step S9 are performed as in the first embodiment, the gate insulating film 42, the base coat film 3, and the resin layer 22 are patterned using the resist film formed in step S9 to form the grooves 7 (step S10"). In the present embodiment, an etching time required to achieve the depth of the groove 7 in the resin layer 22 is determined in advance, and the etching time is set to this determined time. Then, the etching time of the resin layer 22 is stopped when the set time is reached. As a result, portions of the gate insulating film 42, the base coat film 3 immediately below the gate insulating film 42, and the resin layer 22 immediately below the base coat film 3 can be removed to form the grooves 7 having a desired depth.

Next, as illustrated in FIG. 17, step S11 to step S17 are performed as in the first embodiment. Subsequently, step S18 to step S34 illustrated in FIG. 8 are performed, and then step S35 to step S48 illustrated in FIG. 8 are performed, as in the first embodiment. In this manner, the display device 1 according to the present embodiment is manufactured.

As described above, in the present embodiment, as the groove 7, a groove having a depth that passes through the gate insulating film 42 and the base coat film 3 and reaches the resin layer 22 is provided. According to the present embodiment, the groove 7 is provided in the gate insulating film 42, the base coat film 3, and the resin layer 22, making it possible to guide a crack more reliably than in the first and second embodiments.

The disclosure is not limited to the embodiments described above, and various modifications may be made within the scope of the claims. Embodiments obtained by appropriately combining technical approaches disclosed in the different embodiments also fall within the technical scope of the disclosure. Furthermore, novel technical features can be formed by combining the technical approaches disclosed in each of the embodiments.

The invention claimed is:

1. A display device comprising:
   a substrate;
   a semiconductor layer;
   a gate insulating film;
   a first wiring line;
   a first interlayer insulating film;
   a second wiring line;
   a second interlayer insulating film;
   a third wiring line;
   a display region; and
   a frame region surrounding the display region,
   wherein the substrate, the semiconductor layer, the gate insulating film, the first wiring line, the first interlayer insulating film, the second wiring line, the second interlayer insulating film, and the third wiring line are provided in this order,
   the display region is provided with
   a plurality of control lines included in the first wiring line and extending in a first direction,
   a plurality of data signal lines included in the third wiring line and extending in a second direction orthogonal to the first direction,
   a plurality of subpixels provided correspondingly to intersecting portions between the plurality of control lines and the plurality of data signal lines,
   a plurality of light-emitting elements provided correspondingly to the plurality of subpixels,
   a plurality of coupling semiconductor layers included in the semiconductor layer, and extending in the second direction across the plurality of subpixels in the second direction, intersecting the plurality of control lines in a plan view, and
   a plurality of first grooves and a plurality of second grooves formed between adjacent control lines of the plurality of control lines in the gate insulating film and spaced apart from the plurality of control lines, in a plan view,
   wherein each of the plurality of first grooves extends in the second direction along a coupling semiconductor layer of the plurality of coupling semiconductor layers, between the adjacent control lines, in a plan view, and
   each of the plurality of second grooves extends in a direction intersecting a first groove of the plurality of first grooves, and is adjacent to at least one end portion of the first groove.

2. The display device according to claim 1,
   wherein the plurality of second grooves extend in a direction intersecting the plurality of first grooves.

3. The display device according to claim 2,
wherein each of the plurality of first grooves and each of the plurality of second grooves are coupled in a T-shape at the at least one end portion of the first groove, in a plan view.

4. The display device according to claim 2,
wherein each of the plurality of first grooves and each of the plurality of second grooves are coupled in an L-shape at the at least one end portion of the first groove, in a plan view.

5. The display device according to claim 3,
wherein the plurality of second grooves are respectively coupled to both end portions of the plurality of first grooves.

6. The display device according to claim 1,
wherein each of the plurality of second grooves is spaced apart from each of the plurality of first grooves.

7. The display device according to claim 6,
wherein the plurality of second grooves are respectively adjacent to both end portions of the plurality of first grooves.

8. The display device according to claim 1,
wherein the plurality of second grooves are respectively adjacent to the plurality of control lines, in a plan view.

9. The display device according to claim 1,
wherein a base coat film is further provided between the substrate and the semiconductor layer,
the gate insulating film is provided on the base coat film, covering the semiconductor layer, and
the plurality of first grooves and the plurality of second grooves each have a depth, from the gate insulating film, that reaches at least the base coat film immediately below the gate insulating film.

10. The display device according to claim 9,
wherein the plurality of first grooves and the plurality of second grooves each have a depth, from the gate insulating film, that reaches the substrate.

11. The display device according to claim 9,
wherein the gate insulating film and the base coat film are formed of at least one type of inorganic insulating film selected from the group consisting of a silicon nitride film and a silicon oxide film.

12. The display device according to claim 1,
wherein each of the plurality of coupling semiconductor layers is formed of low-temperature polycrystalline silicon.

13. The display device according to claim 1,
wherein the substrate is formed of a resin.

* * * * *